United States Patent
Maxim et al.

(10) Patent No.: US 9,628,042 B2
(45) Date of Patent: Apr. 18, 2017

(54) MULTI-BAND IMPEDANCE TUNERS USING WEAKLY-COUPLED LC RESONATORS

(71) Applicant: RF Micro Devices, Inc., Greensboro, NC (US)

(72) Inventors: George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 89 days.

(21) Appl. No.: 14/554,943

(22) Filed: Nov. 26, 2014

(65) Prior Publication Data

US 2015/0084718 A1    Mar. 26, 2015

Related U.S. Application Data

(63) Continuation-in-part of application No. 14/099,007, filed on Dec. 6, 2013, now Pat. No. 9,196,406, and a
(Continued)

(51) Int. Cl.
*H03H 7/01* (2006.01)
*H03H 7/40* (2006.01)
(Continued)

(52) U.S. Cl.
CPC ....... *H03H 7/0161* (2013.01); *H01F 17/0013* (2013.01); *H03F 1/565* (2013.01);
(Continued)

(58) Field of Classification Search
CPC ...... H03H 2007/386; H03H 7/38; H03H 7/40; H03H 7/0115; H03H 7/0161; H03H 7/1775; H03H 7/1766
(Continued)

(56) References Cited

U.S. PATENT DOCUMENTS

| | | |
|---|---|---|
| 3,597,709 A | 8/1971 | Rhodes |
| 3,718,874 A | 2/1973 | Cooper, Jr. |

(Continued)

FOREIGN PATENT DOCUMENTS

| | | |
|---|---|---|
| EP | 1184977 A2 | 3/2002 |
| JP | 07015253 A | 1/1995 |

(Continued)

OTHER PUBLICATIONS

Non-Final Office Action for U.S. Appl. No. 14/298,830, mailed Dec. 3, 2015, 10 pages.
(Continued)

*Primary Examiner* — Stephen E Jones
*Assistant Examiner* — Rakesh Patel
(74) *Attorney, Agent, or Firm* — Withrow & Terranova, P.L.L.C.

(57) ABSTRACT

Radio frequency (RF) filter structures and related methods and RF front-end circuitry are disclosed. In one embodiment, an RF filter structure includes a first terminal and a first tunable RF filter path defined between the first terminal and a second terminal. The first tunable RF filter path is tunable to provide impedance matching between the first terminal and the second terminal at a first frequency. The first frequency may be provided within a first frequency band. Additionally, the RF filter structure includes a second tunable RF filter path defined between the first terminal and the second terminal. The second tunable RF filter path is tunable to provide impedance matching between the first terminal and the second terminal at a second frequency. The second frequency may be within a second frequency band. In this manner, the RF filter structure is configured to provide impedance tuning for multiple impedance bands simultaneously.

25 Claims, 13 Drawing Sheets

Related U.S. Application Data continuation-in-part of application No. 14/215,815, filed on Mar. 17, 2014, now Pat. No. 9,294,045, and a continuation-in-part of application No. 14/217,199, filed on Mar. 17, 2014, and a continuation-in-part of application No. 14/216,794, filed on Mar. 17, 2014, now Pat. No. 9,294,046, and a continuation-in-part of application No. 14/215,800, filed on Mar. 17, 2014, and a continuation-in-part of application No. 14/218,953, filed on Mar. 18, 2014, now Pat. No. 9,444,411, and a continuation-in-part of application No. 14/216,376, filed on Mar. 17, 2014, now Pat. No. 9,391,565, and a continuation-in-part of application No. 14/216,560, filed on Mar. 17, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, and a continuation-in-part of application No. 14/449,913, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,863, filed on Jun. 6, 2014, and a continuation-in-part of application No. 14/298,852, filed on Jun. 6, 2014, now Pat. No. 9,564,869, application No. 14/554,943, which is a continuation-in-part of application No. 14/450,156, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, and a continuation-in-part of application No. 14/099,007, filed on Dec. 6, 2013, now Pat. No. 9,196,406, application No. 14/450,028, which is a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, application No. 14/554,943, which is a continuation-in-part of application No. 14/449,764, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, application No. 14/554,943, which is a continuation-in-part of application No. 14/450,199, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, application No. 14/554,943, which is a continuation-in-part of application No. 14/450,204, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, application No. 14/554,943, which is a continuation-in-part of application No. 14/450,200, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869, application No. 14/554,943, which is a continuation-in-part of application No. 14/449,594, filed on Aug. 1, 2014, now Pat. No. 9,048,836, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,564,869.

(60) Provisional application No. 61/909,028, filed on Nov. 26, 2013, provisional application No. 61/938,884, filed on Feb. 12, 2014, provisional application No. 61/946,270, filed on Feb. 28, 2014, provisional application No. 61/946,927, filed on Mar. 3, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/789,693, filed on Mar. 15, 2013, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014.

(51) Int. Cl.
*H01F 17/00* (2006.01)
*H03F 1/56* (2006.01)
*H03F 3/24* (2006.01)
*H03H 7/38* (2006.01)

(52) U.S. Cl.
CPC ............ *H03F 3/245* (2013.01); *H03H 7/0115* (2013.01); *H03H 7/1708* (2013.01); *H03H 7/1716* (2013.01); *H03H 7/1766* (2013.01); *H03H 7/1775* (2013.01); *H03H 7/40* (2013.01); *H03F 2200/546* (2013.01); *H03H 2007/386* (2013.01)

(58) Field of Classification Search
USPC .............. 333/17.3, 124, 126, 129, 174, 175
See application file for complete search history.

(56) References Cited

U.S. PATENT DOCUMENTS

| | | | |
|---|---|---|---|
| 3,794,941 A | 2/1974 | Templin | |
| 4,361,894 A | 11/1982 | Kurihara et al. | |
| 5,339,017 A | 8/1994 | Yang | |
| 5,608,363 A | 3/1997 | Cameron et al. | |
| 5,661,414 A | 8/1997 | Shigehara et al. | |
| 5,689,144 A | 11/1997 | Williams | |
| 5,841,330 A | 11/1998 | Wenzel et al. | |
| 5,880,620 A | 3/1999 | Gitlin et al. | |
| 5,896,073 A | 4/1999 | Miyazaki et al. | |
| 5,963,557 A | 10/1999 | Eng | |
| 6,215,374 B1 | 4/2001 | Petrovic | |
| 6,233,438 B1 | 5/2001 | Wynn | |
| 6,239,673 B1 | 5/2001 | Wenzel et al. | |
| 6,529,750 B1 | 3/2003 | Zhang et al. | |
| 6,664,873 B2 | 12/2003 | Tiihonen | |
| 6,801,102 B2 | 10/2004 | Shamsaifar et al. | |
| 7,015,870 B2 | 3/2006 | Guitton et al. | |
| 7,116,186 B2 | 10/2006 | Chen | |
| 7,795,995 B2 | 9/2010 | White et al. | |
| 7,809,349 B1 | 10/2010 | Granger-Jones et al. | |
| 7,825,751 B2 | 11/2010 | Kawaguchi et al. | |
| 8,204,446 B2 | 6/2012 | Scheer et al. | |
| 8,314,653 B1 | 11/2012 | Granger-Jones et al. | |
| 8,346,179 B2 | 1/2013 | Brunn et al. | |
| 8,626,083 B2 | 1/2014 | Greene et al. | |
| 8,736,511 B2 | 5/2014 | Morris, III | |
| 8,742,871 B2 * | 6/2014 | Jin | H03H 7/075 333/175 |
| 8,751,993 B1 | 6/2014 | Fenzi et al. | |
| 8,791,769 B2 | 7/2014 | Leong et al. | |
| 8,803,632 B2 | 8/2014 | Takeuchi | |
| 8,803,634 B2 | 8/2014 | Hanaoka | |
| 8,841,983 B2 | 9/2014 | Newton et al. | |
| 8,884,714 B2 | 11/2014 | Carey et al. | |
| 8,977,216 B2 | 3/2015 | Weissman et al. | |
| 9,002,309 B2 | 4/2015 | Sahota et al. | |
| 9,054,648 B1 | 6/2015 | Xu | |
| 9,094,104 B2 | 7/2015 | Din et al. | |
| 9,124,355 B2 | 9/2015 | Black et al. | |
| 9,203,455 B2 | 12/2015 | Yang et al. | |
| 2001/0020877 A1 | 9/2001 | Hasegawa et al. | |
| 2002/0057139 A1 | 5/2002 | Matsumura et al. | |
| 2003/0008577 A1 | 1/2003 | Quigley et al. | |
| 2003/0151409 A1 | 8/2003 | Marek | |
| 2003/0222732 A1 | 12/2003 | Matthaei | |
| 2004/0127178 A1 | 7/2004 | Kuffner | |
| 2004/0130414 A1 | 7/2004 | Marquardt et al. | |
| 2004/0162042 A1 | 8/2004 | Chen et al. | |
| 2004/0196085 A1 | 10/2004 | Shen | |
| 2004/0222868 A1 | 11/2004 | Rathgeber et al. | |
| 2004/0266378 A1 | 12/2004 | Fukamachi et al. | |
| 2005/0195063 A1 | 9/2005 | Mattsson | |
| 2005/0237144 A1 | 10/2005 | Einsinger et al. | |
| 2006/0033602 A1 | 2/2006 | Mattsson | |
| 2006/0035600 A1 | 2/2006 | Lee et al. | |
| 2006/0038635 A1 | 2/2006 | Richiuso et al. | |
| 2006/0125465 A1 | 6/2006 | Xiang et al. | |
| 2006/0220727 A1 | 10/2006 | Yen | |
| 2006/0226943 A1 | 10/2006 | Marques | |
| 2006/0261890 A1 | 11/2006 | Floyd et al. | |
| 2006/0281431 A1 | 12/2006 | Isaac et al. | |
| 2007/0091006 A1 | 4/2007 | Thober et al. | |
| 2007/0161361 A1 | 7/2007 | Vaisanen et al. | |
| 2007/0182520 A1 | 8/2007 | Kawakubo et al. | |
| 2007/0194859 A1 | 8/2007 | Brobston et al. | |
| 2007/0241839 A1 | 10/2007 | Taniguchi | |
| 2008/0096516 A1 | 4/2008 | Mun et al. | |
| 2008/0122560 A1 | 5/2008 | Liu | |
| 2008/0220735 A1 | 9/2008 | Kim et al. | |
| 2008/0297299 A1 | 12/2008 | Yun et al. | |
| 2009/0088110 A1 | 4/2009 | Schuur et al. | |
| 2009/0289721 A1 | 11/2009 | Rajendran et al. | |
| 2010/0144305 A1 | 6/2010 | Cook et al. | |
| 2010/0188171 A1 | 7/2010 | Mohajer-Iravani et al. | |
| 2010/0283557 A1 | 11/2010 | Taniguchi | |
| 2011/0010749 A1 * | 1/2011 | Alkan | H03H 1/00 725/127 |
| 2011/0103494 A1 | 5/2011 | Ahmadi | |
| 2011/0156835 A1 | 6/2011 | Nagai | |
| 2011/0159834 A1 | 6/2011 | Salvi | |
| 2011/0163824 A1 | 7/2011 | Kawano | |
| 2011/0169589 A1 | 7/2011 | Franzon et al. | |
| 2011/0210787 A1 * | 9/2011 | Lee | H03F 1/56 330/126 |
| 2011/0241163 A1 | 10/2011 | Liu et al. | |
| 2012/0051409 A1 | 3/2012 | Brobston et al. | |
| 2012/0081192 A1 | 4/2012 | Hanaoka | |
| 2012/0230227 A1 | 9/2012 | Weiss | |
| 2012/0249266 A1 | 10/2012 | Lim et al. | |
| 2012/0262252 A1 | 10/2012 | Tseng et al. | |
| 2012/0286900 A1 | 11/2012 | Kadota et al. | |
| 2013/0049902 A1 | 2/2013 | Hendry et al. | |
| 2013/0244591 A1 | 9/2013 | Weissman et al. | |
| 2013/0281031 A1 | 10/2013 | Gingrich et al. | |
| 2013/0295863 A1 | 11/2013 | Shanan | |
| 2014/0015603 A1 | 1/2014 | Scott et al. | |
| 2014/0035358 A1 | 2/2014 | Ichikawa | |
| 2014/0106698 A1 | 4/2014 | Mi et al. | |
| 2014/0113573 A1 | 4/2014 | Khatri et al. | |
| 2014/0133189 A1 | 5/2014 | Worek | |
| 2014/0141738 A1 | 5/2014 | Janesch | |
| 2014/0146737 A1 | 5/2014 | Ohshima et al. | |

(56) References Cited

U.S. PATENT DOCUMENTS

| | | |
|---|---|---|
| 2014/0162712 A1 | 6/2014 | Feld et al. |
| 2014/0167877 A1 | 6/2014 | Shimizu et al. |
| 2014/0192845 A1 | 7/2014 | Szini et al. |
| 2014/0225680 A1 | 8/2014 | Fujiwara et al. |
| 2014/0232467 A1 | 8/2014 | Mukai et al. |
| 2014/0285286 A1 | 9/2014 | Bojer |
| 2014/0323071 A1 | 10/2014 | Liao |
| 2014/0328220 A1 | 11/2014 | Khlat et al. |
| 2015/0002240 A1 | 1/2015 | Reiha |
| 2015/0042399 A1 | 2/2015 | Imbornone et al. |
| 2015/0116950 A1 | 4/2015 | Yoo et al. |

FOREIGN PATENT DOCUMENTS

| | | |
|---|---|---|
| JP | 2010141827 A | 6/2010 |
| KR | 100812098 B1 | 3/2008 |
| WO | 0146971 A1 | 6/2001 |
| WO | 2005117255 A1 | 12/2005 |

OTHER PUBLICATIONS

Non-Final Office Action for U.S. Appl. No. 14/298,863, mailed Jan. 7, 2016, 16 pages.
Non-Final Office Action for U.S. Appl. No. 14/298,852, mailed Dec. 22, 2015, 7 pages.
Non-Final Office Action for U.S. Appl. No. 14/450,028, mailed Dec. 10, 2015, 11 pages.
Non-Final Office Action for U.S. Appl. No. 14/555,053, mailed Dec. 31, 2015, 5 pages.
Final Office Action for U.S. Appl. No. 14/215,800, mailed Mar. 11, 2016, 6 pages.
Final Office Action for U.S. Appl. No. 14/298,829, mailed Feb. 3, 2016, 10 pages.
Non-Final Office Action for U.S. Appl. No. 14/450,156, mailed Mar. 14, 2016, 11 pages.
Non-Final Office Action for U.S. Appl. No. 14/450,200, mailed Feb. 29, 2016, 13 pages.
International Preliminary Report on Patentability for PCT/US2014/048608, mailed Feb. 11, 2016, 14 pages.
Notice of Allowance for U.S. Appl. No. 14/298,829, mailed May 20, 2016, 9 pages.
Notice of Allowance for U.S. Appl. No. 14/298,830, mailed Apr. 7, 2016, 9 pages.
Non-Final Office Action for U.S. Appl. No. 14/449,913, mailed Mar. 28, 2016, 15 pages.
Notice of Allowance for U.S. Appl. No. 14/298,852, mailed May 13, 2016, 9 pages.
Final Office Action for U.S. Appl. No. 14/450,028, mailed Mar. 31, 2016, 12 pages.
Non-Final Office Action for U.S. Appl. No. 14/449,764, mailed May 4, 2016, 12 pages.
Non-Final Office Action for U.S. Appl. No. 14/450,199, mailed Apr. 20, 2016, 7 pages.
Non-Final Office Action for U.S. Appl. No. 14/450,204, mailed Apr. 22, 2016, 8 pages.
Notice of Allowance for U.S. Appl. No. 14/555,053, mailed Apr. 19, 2016, 7 pages.
Non-Final Office Action for U.S. Appl. No. 14/298,829, mailed Jun. 22, 2015, 8 pages.
Hoppenjans, Eric E. et al., "A Vertically Integrated Tunable UHF Filter," International Microwave Symposium Digest (MTT), May 23-28, 2010, Anaheim, California, IEEE, pp. 1380-1383.
Joshi, H. et al., "Tunable high Q narrow-band triplexer," IEEE MTT-S International Microwave Symposium Digest, Jun. 7-12, 2009, Boston, MA, IEEE, pp. 1477-1480.
Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.
International Search Report and Written Opinion for PCT/US2014/030431, mailed Jun. 20, 2014, 14 pages.
Invitation to Pay Additional Fees and, Where Applicable, Protest Fee for PCT/US2014/048608, mailed Oct. 21, 2014, 7 pages.
International Search Report and Written Opinion for PCT/US2014/048608, mailed Dec. 16, 2014, 18 pages.
International Preliminary Report on Patentability for PCT/US/2014/030431, mailed Sep. 24, 2015, 10 pages.
Non-Final Office Action for U.S. Appl. No. 14/215,800, mailed Nov. 20, 2015, 5 pages.
Final Office Action for U.S. Appl. No. 14/298,863, mailed Jun. 3, 2016, 17 pages.
Notice of Allowance for U.S. Appl. No. 14/298,852, mailed Jul. 13, 2016, 9 pages.
Notice of Allowance for U.S. Appl. No. 14/450,199, mailed Aug. 1, 2016, 7 pages.
Final Office Action for U.S. Appl. No. 14/450,200, mailed Jun. 14, 2016, 13 pages.
Non-Final Office Action for U.S. Appl. No. 14/555,557, mailed Jun. 13, 2016, 28 pages.
Advisory Action for U.S. Appl. No. 14/450,028, mailed Aug. 2, 2016, 3 pages.
Non-Final Office Action for U.S. Appl. No. 14/215,800, mailed Aug. 11, 2016, 6 pages.
Final Office Action for U.S. Appl. No. 14/215,800, mailed Feb. 8, 2017, 7 pages.
Final Office Action for U.S. Appl. No. 14/298,863, mailed Feb. 14, 2017, 10 pages.
Notice of Allowance for U.S. Appl. No. 14/449,913, mailed Dec. 7, 2016, 7 pages.
Final Office Action for U.S. Appl. No. 14/450,028, mailed Jan. 19, 2017, 12 pages.
Non-Final Office Action for U.S. Appl. No. 14/450,204, mailed Feb. 1, 2017, 9 pages.
Notice of Allowance and Examiner-Initiated Interview Summary for U.S. Appl. No. 14/450,200, mailed Feb. 10, 2017, 8 pages.
Non-Final Office Action for U.S. Appl. No. 14/555,557, mailed Feb. 13, 2017, 21 pages.
Notice of Allowance for U.S. Appl. No. 15/223,416, mailed Dec. 2, 2016, 8 pages.
Non-Final Office Action for U.S. Appl. No. 15/240,420, mailed Jan. 26, 2017, 7 pages.
Non-Final Office Action for U.S. Appl. No. 15/241,823, mailed Jan. 17, 2017, 6 pages.
Non-Final Office Action for U.S. Appl. No. 14/554,975, mailed Feb. 16, 2017, 9 pages.

* cited by examiner

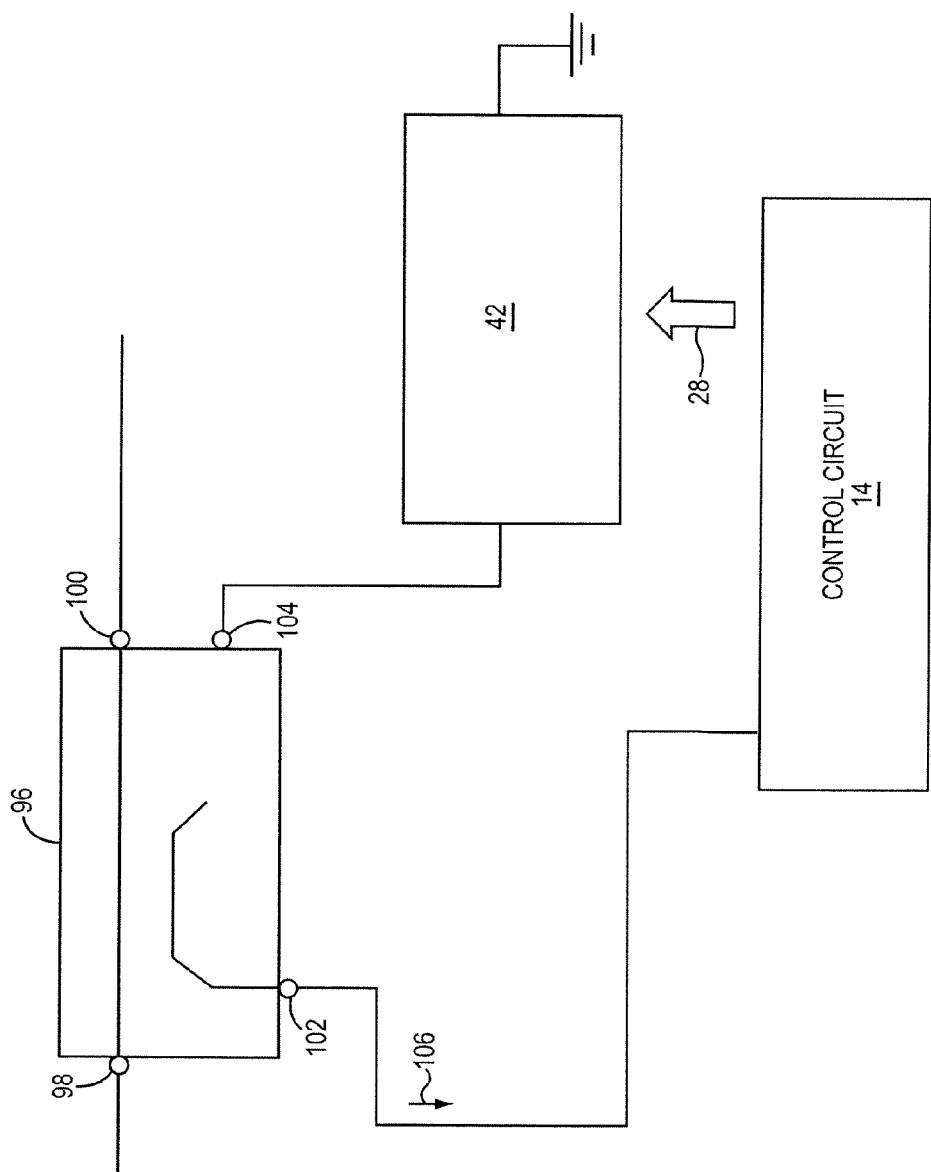

MULTI-BAND IMPEDANCE TUNERS USING WEAKLY-COUPLED LC RESONATORS

RELATED APPLICATIONS

The present application claims priority to U.S. Provisional Patent Applications No. 61/909,028, filed Nov. 26, 2013; No. 61/938,884, filed Feb. 12, 2014; No. 61/946,270, filed Feb. 28, 2014; No. 61/946,927, filed Mar. 3, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014.

The present application claims the benefit of and is a Continuation-in-Part of U.S. patent application Ser. No. 14/099,007, filed Dec. 6, 2013, now U.S. Pat. No. 9,196,406, entitled "HIGH Q FACTOR INDUCTOR STRUCTURE," which claims priority to U.S. Provisional Patent Applications No. 61/789,693, filed Mar. 15, 2013; No. 61/831,666, filed Jun. 6, 2013; No. 61/860,932, filed Aug. 1, 2013; and No. 61/909,028, filed Nov. 26, 2013.

The present application claims the benefit of and is a Continuation-in-Part of U.S. patent application Ser. No. 14/215,815, filed Mar. 17, 2014, now U.S. Pat. No. 9,294,045, entitled "GAIN AND PHASE CALIBRATION FOR CLOSED LOOP FEEDBACK LINEARIZED AMPLIFIERS," which claims priority to U.S. Provisional Patent Applications No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; No. 61/946,270, filed Feb. 28, 2014; and No. 61/946,927, filed Mar. 3, 2014.

The present application claims the benefit of and is a Continuation-in-Part of U.S. patent application Ser. No. 14/217,199, filed Mar. 17, 2014, entitled "POWER AMPLIFIER WITH WIDE DYNAMIC RANGE AM FEEDBACK LINEARIZATION SCHEME," which claims priority to U.S. Provisional Patent Applications No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/216,794, filed Mar. 17, 2014, now U.S. Pat. No. 9,294,046, entitled "RF POWER AMPLIFIER WITH PM FEEDBACK LINEARIZATION," which claims priority to U.S. Provisional Patent Applications No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/215,800, filed Mar. 17, 2014, entitled "WEAKLY COUPLED BASED HARMONIC REJECTION FILTER FOR FEEDBACK LINEARIZATION POWER AMPLIFIER," which claims priority to U.S. Provisional Patent Applications No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/218,953, filed Mar. 18, 2014, now U.S. Pat. No. 9,444,411, entitled "RF POWER AMPLIFIER WITH TOTAL RADIATED POWER STABILIZATION," which claims priority to U.S. Provisional Patent Applications No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/216,376, filed Mar. 17, 2014, now U.S. Pat. No. 9,391,565, entitled "AMPLIFIER PHASE DISTORTION CORRECTION BASED ON AMPLITUDE DISTORTION MEASUREMENT," which claims priority to U.S. Provisional Patent Applications No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/216,560, filed Mar. 17, 2014, entitled "RF REPLICATOR FOR ACCURATE MODULATED AMPLITUDE AND PHASE MEASUREMENT," which claims priority to U.S. Provisional Patent Applications No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/298,829, filed Jun. 6, 2014, now U.S. Pat. No. 9,455,680, entitled "TUNABLE RF FILTER STRUCTURE FORMED BY A MATRIX OF WEAKLY COUPLED RESONATORS," which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,830, filed Jun. 6, 2014, now U.S. Pat. No. 9,419,578, entitled "TUNABLE RF FILTER PATHS FOR TUNABLE RF FILTER STRUCTURES," which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,834, filed Jun. 6, 2014, entitled "HIGH QUALITY FACTOR INTERCONNECT FOR RF CIRCUITS," which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr.

23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,872, filed Jun. 6, 2014, now U.S. Pat. No. 9,484,879, entitled "NONLINEAR CAPACITANCE LINEARIZATION," which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,863, filed Jun. 6, 2014, entitled "TUNABLE RF FILTER BASED RF COMMUNICATIONS SYSTEM," which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,852, filed Jun. 6, 2014, now U.S. Pat. No. 9,564,869, entitled "MULTI-BAND INTERFERENCE OPTIMIZATION," which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/449,913, filed Aug. 1, 2014, entitled "COOPERATIVE TUNABLE RF FILTERS," which claims priority to U.S. Provisional Patent Applications No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/449,913, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,834, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,872, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,863, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,852, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,156, filed Aug. 1, 2014, entitled "ADVANCED 3D INDUCTOR STRUCTURES WITH CONFINED MAGNETIC FIELD," which claims priority to No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,156, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,834, filed Jun. 6, 2014, which claims priority to U.S. Provisional Patent Applications No. 61/831,666, filed Jun. 6, 2013; No. 61/860, 932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,872, filed Jun. 6, 2014, which claims priority to U.S. Provisional Patent Applications No. 61/831,666, filed Jun. 6, 2013; No. 61/860, 932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,863, filed Jun. 6, 2014, which claims priority to U.S. Provisional Patent Applications No. 61/831,666, filed Jun. 6, 2013; No. 61/860, 932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,852, filed Jun. 6, 2014, which claims priority to U.S. Provisional Patent Applications No. 61/831,666, filed Jun. 6, 2013; No. 61/860, 932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/099,007, filed Dec. 6, 2013, entitled "HIGH Q FACTOR INDUCTOR STRUCTURE," which claims priority to U.S. Provisional Patent Applications No. 61/789,693, filed Mar. 15, 2013; No. 61/831,666, filed Jun. 6, 2013; No. 61/860,932, filed Aug. 1, 2013; and No. 61/909,028, filed Nov. 26, 2013.

The present application claims the benefit of and is a Continuation-in-Part of U.S. patent application Ser. No. 14/450,028, filed Aug. 1, 2014, entitled "VSWR DETECTOR FOR A TUNABLE RF FILTER STRUCTURE," which claims priority to U.S. Provisional Patent Applications No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982, 952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,028, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982, 952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298, 830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982, 952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298, 834, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982, 952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298, 872, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982, 952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298, 863, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982, 952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298, 852, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982, 952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/449,764, filed Aug. 1, 2014, entitled "CALIBRATION FOR A TUNABLE RF FILTER STRUCTURE," which claims priority to U.S. Provisional Patent Applications No. 61/860,932, filed Aug. 1, 2013; No. 61/909,028, filed Nov.

26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/449,764, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,834, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,872, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,863, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,852, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,199, filed Aug. 1, 2014, entitled "WEAKLY COUPLED TUNABLE RF RECEIVER ARCHITECTURE," which claims priority to U.S. Provisional Patent Applications No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,199, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,834, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,872, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,863, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,852, filed Jun. 6, 2014, which claims priority to U.S. Provisional Patent Applications No. 61/831,666, filed Jun. 6, 2013; No. 61/860,932, filed Aug. 1, 2013;

No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,204, filed Aug. 1, 2014, entitled "WEAKLY COUPLED TUNABLE RF TRANSMITTER ARCHITECTURE," which claims priority to U.S. Provisional Patent Applications No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,204, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,834, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,872, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,863, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,852, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,200, filed Aug. 1, 2014, entitled "INTERFERENCE REJECTION RF FILTERS," which claims priority to U.S. Provisional Patent Applications No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,200, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,830, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,834, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,872, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,863, filed Jun. 6, 2014, which claims priority to U.S. Provisional Patent Applications No. 61/831,666, filed Jun. 6, 2013; No. 61/860, 932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,852, filed Jun. 6, 2014, which claims priority to U.S. Provisional Patent Applications No. 61/831,666, filed Jun. 6, 2013; No. 61/860, 932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/449,594, filed Aug. 1, 2014, now U.S. Pat. No. 9,048, 836, entitled "BODY BIAS SWITCHING FOR AN RF SWITCH," which claims priority to U.S. Provisional Patent Applications No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951, 844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/449,594, filed Aug. 1, 2014, is a Continuation-in-Part of U.S. patent application Ser. No. 14/298,829, filed Jun. 6, 2014, which claims priority to U.S. Provisional Patent Applications No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982, 971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,830, filed Jun. 6, 2014, which claims priority to U.S. Provisional Patent Applications No. 61/831, 666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982, 971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,834, filed Jun. 6, 2014, which claims priority to U.S. Provisional Patent Applications No. 61/831, 666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982, 971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,872, filed Jun. 6, 2014, which claims priority to U.S. Provisional Patent Applications No. 61/831, 666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982, 971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,863, filed Jun. 6, 2014, which claims priority to U.S. Provisional Patent Applications No. 61/831, 666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982, 971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,852, filed Jun. 6, 2014, which claims priority to U.S. Provisional Patent Applications No. 61/831, 666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982, 971, filed Apr. 23, 2014; and No. 62/008,192, filed Jun. 5, 2014.

The present application is related to concurrently filed U.S. patent application Ser. No. 14/555,053, entitled "WEAKLY COUPLED RF NETWORK BASED POWER AMPLIFIER ARCHITECTURE," now issued U.S. Pat. No. 9,444,417, issued on Sep. 13, 2016; concurrently filed U.S. patent application Ser. No. 14/555,557, entitled "HYBRID ACTIVE AND PASSIVE TUNABLE RF FILTERS;" concurrently filed U.S. patent application Ser. No. 14/555,371, entitled "FILTERING CHARACTERISTIC ADJUSTMENTS OF WEAKLY COUPLED TUNABLE RF FILTERS;" and concurrently filed U.S. patent application Ser. No. 14/554,975, entitled "RF FILTER STRUCTURE FOR ANTENNA DIVERSITY AND BEAM FORMING."

All of the applications listed above are hereby incorporated herein by reference in their entireties.

FIELD OF THE DISCLOSURE

Embodiments of the present disclosure relate to radio frequency (RF) communications systems, which may include RF front-end circuitry, RF transceiver circuitry, RF amplifiers, direct current (DC)-DC converters, RF filters, RF antennas, RF switches, RF combiners, RF splitters, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

Radio frequency (RF) filter structures and related methods and RF front-end circuitry are disclosed. The RF filter structures can be used to provide impedance tuning for one or more impedance bands. In one embodiment, an RF filter structure includes a first terminal and a first tunable RF filter path defined between the first terminal and the second terminal. The first tunable RF filter path is configured to be tunable to provide impedance matching between the first terminal and the second terminal at a first frequency. The first frequency may be provided within a first frequency band. The RF filter structure may also include a second tunable RF filter path also defined between the first terminal and the second terminal. The second tunable RF filter path is configured to be tunable to provide impedance matching between the first terminal and the second terminal at a second frequency. The second frequency may be within a second frequency band. In this manner, the RF filter structure is configured to provide impedance tuning for multiple impedance bands simultaneously.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 10:
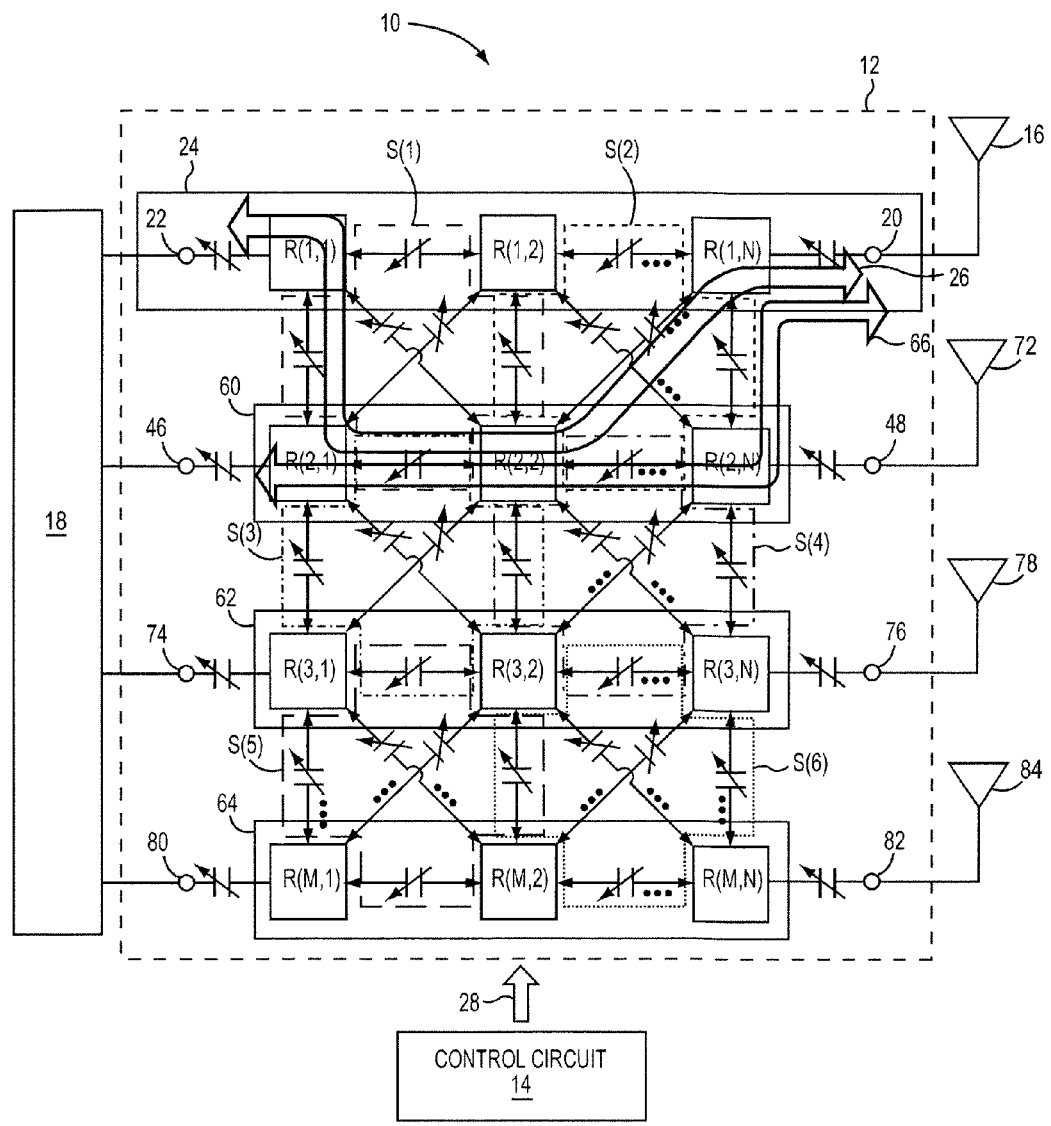
FIG. 10 illustrates an embodiment of the RF front-end circuitry with an RF filter structure formed from a matrix of resonators.
Figure 13:
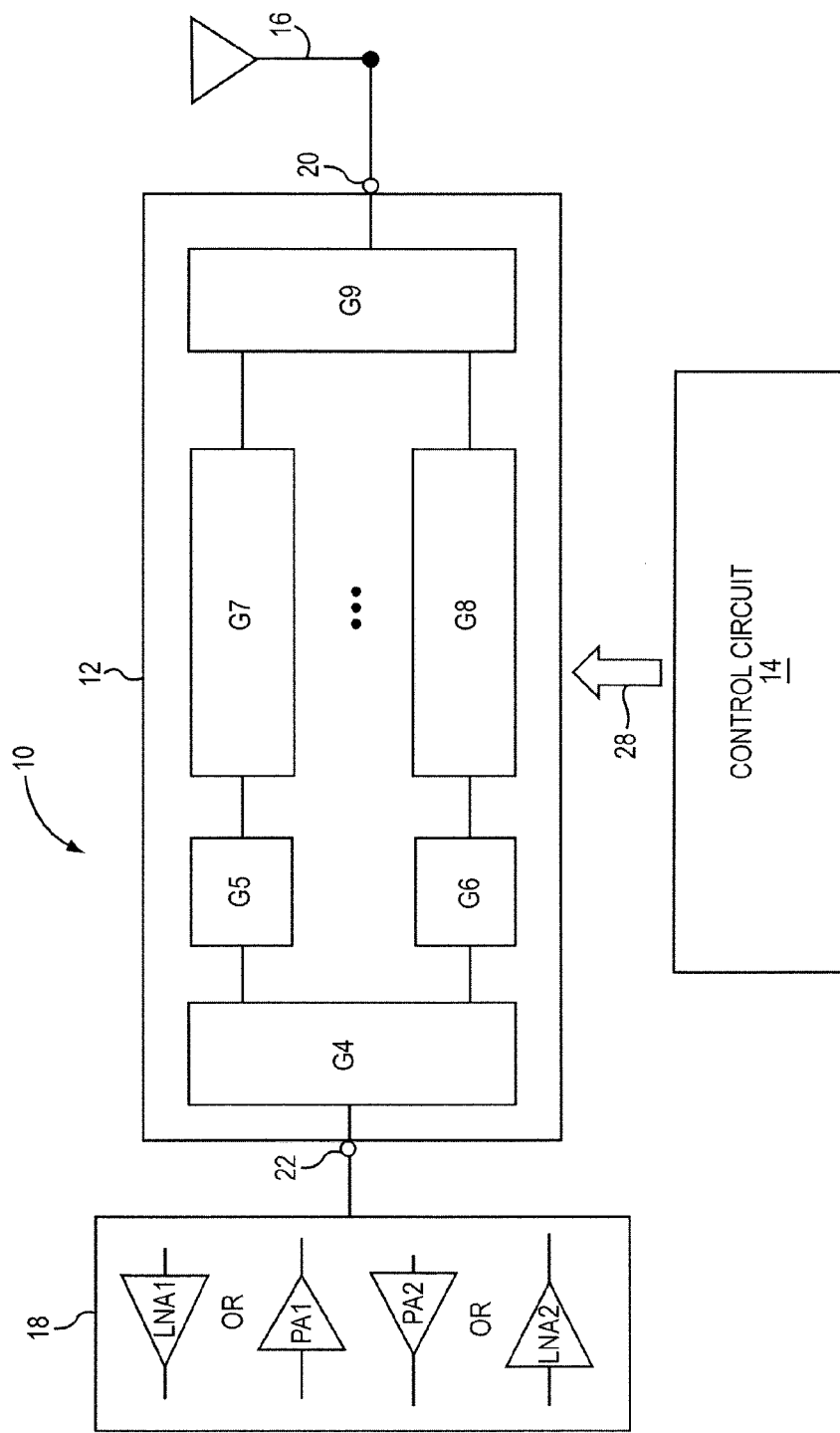

FIG. 13 illustrates an embodiment of the RF front-end circuitry with the RF filter structure shown in FIG. 10, wherein a group of resonators in the RF filter structure is used to provide diplexing at a terminal connected to the antenna, and other groups of resonators in the RF filter structure are used to provide impedance matching, and other groups of resonators are used to provide diplexing at the RF transceiver circuitry.

Figure 14:
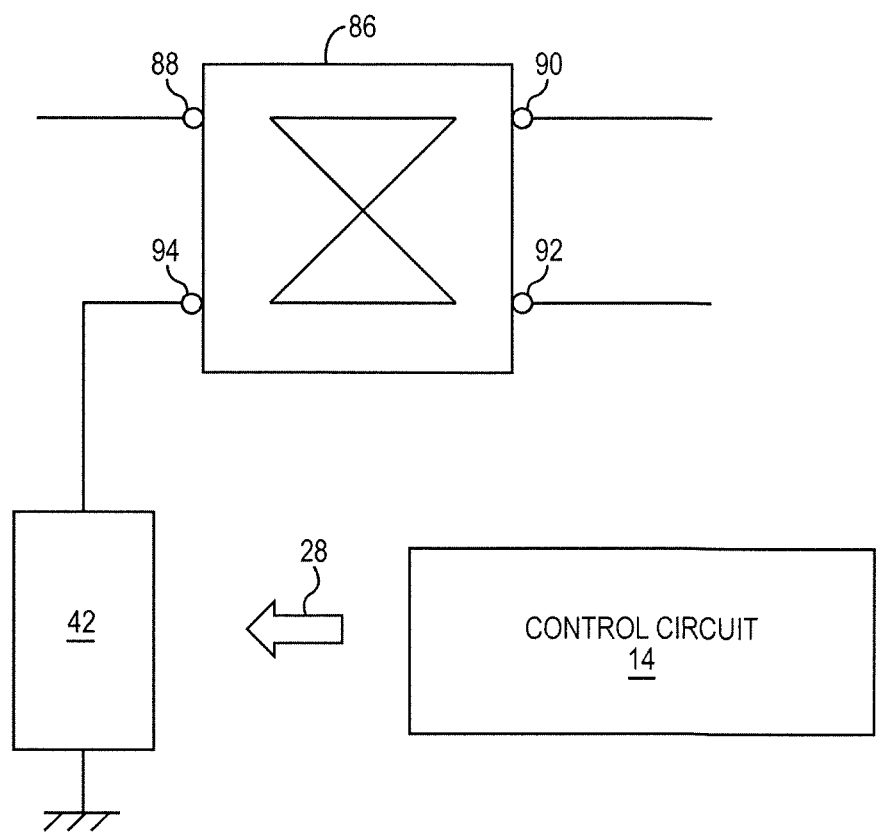

FIG. 14 illustrates an embodiment of a hybrid coupler having a tunable RF filter path connected to provide impedance tuning.

FIG. 15 illustrates an embodiment of a directional coupler having a tunable RF filter path connected to provide impedance tuning.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Note that relational terminology such as "substantially," "approximately," and/or the like, should be interpreted objectively in accordance with the communication device and technological environment in which the radio frequency (RF) front-end circuitry is employed and, in addition, the performance parameters relevant to the operation of the RF front-end circuitry for at least one the particular application of the RF front-end circuitry within the communication device [or at least one prospective communication device] and the technological environment [or at least one prospective technological environment]. Also note that capacitive structures may be described throughout this disclosure as being operable to provide a variable capacitance. These capacitive structures may have any suitable topology. For example, these capacitive structures may be provided as programmable arrays of capacitors, varactors, and/or the like.

Figure 1:
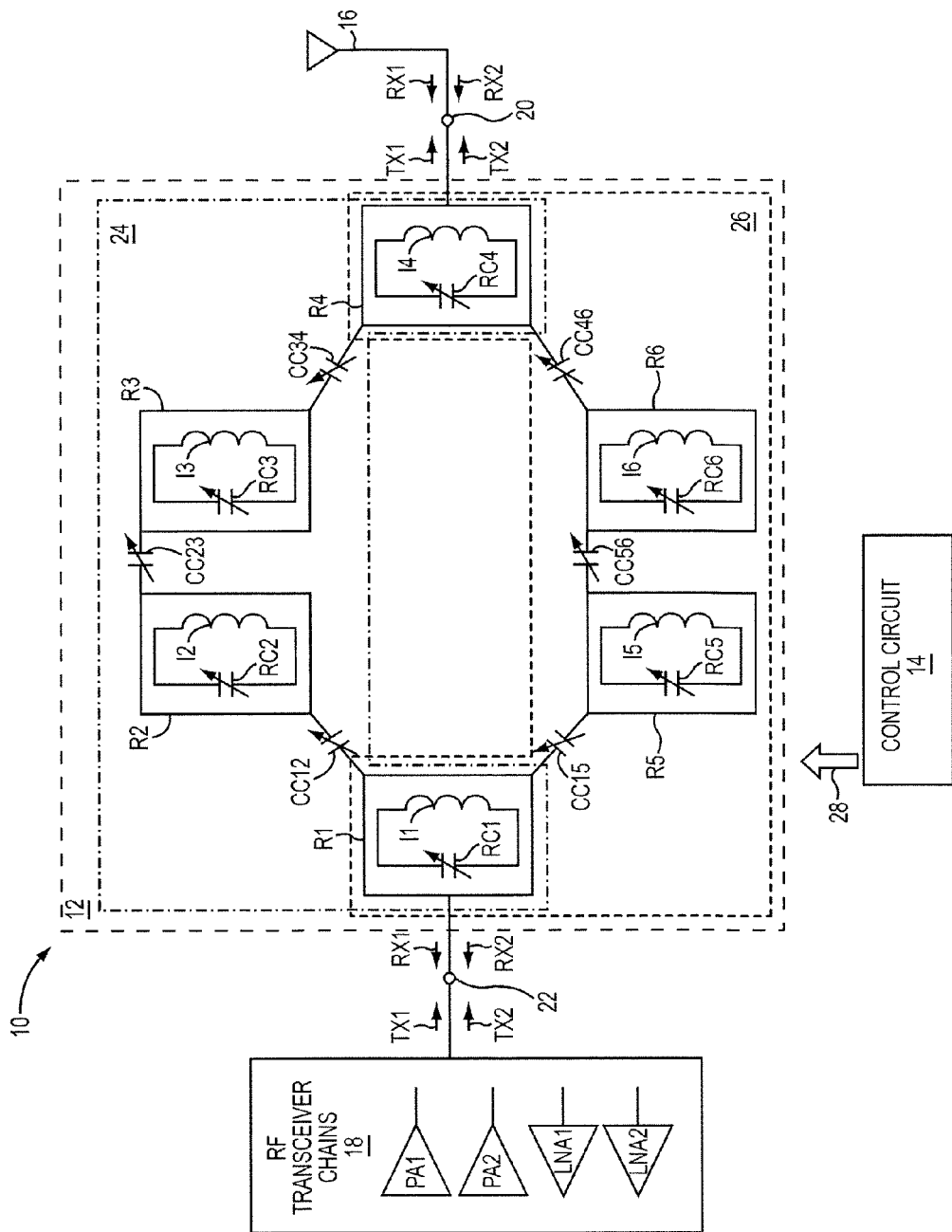
FIG. 1 illustrates an embodiment of a radio frequency (RF) front-end circuitry that includes an RF filter structure having a first tunable RF filter path and a second tunable RF filter path that are each tunable to provide impedance tuning at two different frequencies.

FIG. 1 illustrates exemplary RF front-end circuitry 10 that may be employed in an RF front-end communication circuit of a portable communication device, such as a cell phone, a tablet, a laptop, and/or the like. The RF front-end circuitry 10 includes an exemplary RF filter structure 12 and a control circuit 14. The RF filter structure 12 is tunable and is used to provide impedance matching. The control circuit 14 is configured to tune the RF filter structure 12 so as to provide impedance matching. For example, the RF front-end circuitry 10 includes an antenna 16 and RF transceiver circuitry 18. The antenna 16 is operably associated with the tunable RF filter structure 12 and is capable of emitting or radiating RF signals (e.g., RF transmit signal TX1, RF transmit signal TX2, RF receive signal RX1, and RF receive signal RX2) in different RF frequency bands.

For instance, the RF transceiver circuitry 18 may include RF transmit chains (not expressly shown) that can generate any number of RF transmit signals, such as the RF transmit signals TX1, TX2, to be radiated by the antenna 16 within different RF frequency bands. The RF transceiver chains may include power amplifiers (e.g., PA1, PA2) that are used to amplify the RF transmit signals (e.g., the RF transmit signal TX1, the RF transmit signal TX2) for emission by the antenna 16. In this embodiment, the RF transmit signal TX1 and the RF transmit signal TX2 are provided in different RF communication bands.

Also, the RF transceiver circuitry 18 may include RF receive chains (not expressly shown) that are configured to process any number of RF receive signals, such as the RF receive signals RX1, RX2, after reception by the antenna 16. The RF receive chains may include low noise amplifiers (e.g., LNA1, LNA2) that are used to amplify the RF receive signals (e.g., the RF receive signal RX1, the RF receive signal RX2) for processing by the RF receive chains. In this embodiment, the RF receive signal RX1 and the RF receive signal RX2 are provided in different RF communication bands.

The RF filter structure 12 is tunable so as to provide impedance matching simultaneously for at least two different communication bands. In this embodiment, impedance matching is being provided between the RF filter structure 12 and the antenna 16 and the RF transceiver circuitry 18 and the RF filter structure 12. However, it should be noted that the RF front-end circuitry 10 and the RF filter structure 12 may be utilized in any RF application where impedance tuning is necessary or desired. In FIG. 1, the RF filter structure 12 has a first terminal 20, a second terminal 22, a first tunable RF filter path 24 defined between the first terminal 20 and the second terminal 22, and a second tunable RF filter path 26 defined between the first terminal 20 and the second terminal 22. The first tunable RF filter path 24 is configured to be tunable to provide impedance matching between the first terminal 20 and the second terminal 22 at a first frequency. For example, the first frequency may be the RF signal frequency of the RF transmit signal TX1 and/or the RF receive signal RX1. The second tunable RF filter path 26 is configured to be tunable to provide impedance matching between the first terminal 20 and the second terminal 22 at a second frequency. For example, the second frequency may be the RF signal frequency of the RF transmit signal TX2 and/or the RF receive signal RX2. As such, the different tunable RF filter paths 24, 26 are each used to provide impedance matching between the first terminal 20 and the second terminal 22 at two different RF signal frequencies simultaneously. The first frequency and the second frequency may be within different RF communication bands simultaneously, in accordance with RF communication standards employed to format the RF signals TX1, TX2, RX1, RX2. The first tunable RF filter path 24 and the second tunable RF filter path 26 are also tunable to filter out-of-band noise and spurious emissions from the RF signals TX1, TX2, RX1, RX2 in the different RF frequency bands. In an alternate embodiment, impedance matching may not be desirable but providing a specific complex impedance at a given frequency or frequency range is the goal.

The RF filter structure 12 shown in FIG. 1 includes a plurality of resonators (referred to generically or generally as resonators "R" and specifically as resonators R1, R2, R3, R4, R5, R6). The resonators R may be provided within the first tunable RF filter path 24 and the second tunable RF filter path 26. Note that in this embodiment, the RF filter structure 12 includes six (6) of the resonators R. However, in other embodiments, the RF filter structure 12 may include any number of resonators R. Also, in this embodiment, the RF filter structure 12 only includes the first tunable RF filter path 24 and the second tunable RF filter path 26 connected between the first terminal 20 and the second terminal 22. Alternative embodiments may include any number of additional tunable RF filter paths to provide impedance matching between the first terminal 20 and the second terminal 22 at any number of frequencies and frequency bands. Finally, as explained in further detail below, alternative embodiments may include any number of additional terminals and tunable RF filter paths coupled between the terminals to provide impedance matching between those terminals.

The first tunable RF filter path 24 includes a first subset of the resonators R. More specifically, the first subset of the resonators R included in the first tunable RF filter path 24 are the resonator R1, the resonator R2, the resonator R3, and the resonator R4. Additionally, the second tunable RF filter path 26 includes a second subset of the resonators R. More specifically, the second subset of the resonators R included in the second tunable RF filter path 26 are the resonator R1, the resonator R5, the resonator R6, and the resonator R4. Accordingly, the first subset of the plurality of resonators R included in the first tunable RF filter path 24 and the second subset of the plurality of resonators included in the second tunable RF filter path 26 are not mutually exclusive but rather share the resonators R1 and R4. The resonator R1 is connected to the second terminal 22, and the resonator R4 is connected to the first terminal 20. In alternative embodiments, the first subset and the second subset may be mutually exclusive. For example, the first tunable RF filter path 24 may only include the resonators R2, R3 while the second tunable RF filter path 26 may only include the resonators R5, R6.

As shown in FIG. 1, each of the resonators R may include at least one inductor (referred to generically or generally as inductors I and specifically as inductors I1-I6) and at least one capacitive structure (referred to generically or generally as capacitive structures RC and specifically as capacitive structures RC1-RC6). Each of the inductors I may have an inductance that is fixed or variable as explained in further detail below. Additionally, each of the capacitive structures RC may have a capacitance that is fixed or variable. In this particular embodiment, each of the capacitive structures RC within the resonators R has a variable capacitance.

The resonators R in the RF filter structure 12 may be weakly coupled, moderately coupled, strongly coupled, have no mutual coupling at all, or some any combination of weak, moderate, strong, or no mutual coupling between the different combinations of the resonators R. Also, energy transfer between two weakly coupled resonators R in the first tunable RF filter path 24 and the second tunable RF filter path 26 may be provided by multiple energy transfer components. For example, energy may be transferred between the resonators R only through mutual magnetic coupling, only through mutual electric coupling, or through both mutual electric coupling and mutual magnetic coupling. Ideally, all of the mutual coupling coefficients are provided as designed, but in practice, the mutual coupling coefficients also are the result of parasitics. The inductors I of the resonators R may also have mutual magnetic coupling between them. A total mutual coupling between the resonators R is given by the sum of magnetic and electric coupling. In this disclosure, the resonators R are weakly coupled to one another when an energy transfer factor between the resonators R is greater than approximately 0% but less than 10%. If the energy transfer factor is between approximately 10% and 50%, the resonators are moderately coupled. If the energy transfer factor is above 50%, the resonators R are strongly coupled. If the energy transfer factor is approximately 0%, there is no mutual coupling between the resonators R.

In one example of the RF filter structure 12, the resonators R in the RF filter structure 12 that are adjacent to one another are weakly coupled. Thus, for this example and with respect to the first tunable RF filter path 24, the resonator R1 and the resonator R2 are weakly coupled, the resonator R2 and the resonator R3 are weakly coupled, and the resonator R3 and the resonator R4 are weakly coupled. Also, for this example and with respect to the second tunable RF filter path 26, the resonator R1 and the resonator R5 are weakly coupled, the resonator R5 and the resonator R6 are weakly coupled, and the resonator R6 and the resonator R4 are weakly coupled.

The RF filter structure 12 includes cross-coupling capacitive structures (referred to generically or generally as cross-coupling capacitive structures CC and specifically as cross-coupling capacitive structures CC12, CC23, CC34, CC15, CC56, CC46). The cross-coupling capacitive structures CC each have a variable capacitance that can be varied to set the total mutual coupling between the respective resonators R. As such, a cross-coupling capacitive structure CC12 is connected between the resonator R1 and the resonator R2 such that varying the variable capacitance of the cross-coupling capacitive structure CC12 sets the total mutual coupling factor of the resonator R1 and the resonator R2. A cross-coupling capacitive structure CC23 is connected between the resonator R2 and the resonator R3 such that varying the variable capacitance of the cross-coupling capacitive structure CC23 sets the total mutual coupling factor of the resonator R2 and the resonator R3. A cross-coupling capacitive structure CC34 is connected between the resonator R3 and the resonator R4 such that varying the variable capacitance of the cross-coupling capacitive structure CC34 sets the total mutual coupling factor of the resonator R3 and the resonator R4. A cross-coupling capacitive structure CC15 is connected between the resonator R1 and the resonator R5 such that varying the variable capacitance of the cross-coupling capacitive structure CC15 sets the total mutual coupling factor of the resonator R1 and the resonator R5. A cross-coupling capacitive structure CC56 is connected between the resonator R5 and the resonator R6 such that varying the variable capacitance of the cross-coupling capacitive structure CC56 sets the total mutual coupling factor of the resonator R5 and the resonator R6. A cross-coupling capacitive structure CC46 is connected between the resonator R4 and the resonator R6 such that varying the variable capacitance of the cross-coupling capacitive structure CC46 sets the total mutual coupling factor of the resonator R4 and the resonator R6.

To tune the first tunable RF filter path 24 and the second tunable RF filter path 26, the control circuit 14 is configured to adjust the variable capacitances (and/or the inductance of the inductors I if the inductances are variable) of the capacitive structures RC in the resonators R and the variable capacitances of the cross-coupling capacitive structure CC1. To do this, the control circuit 14 is configured to generate a control output 28. The control output 28 is operable to set the variable capacitance (and/or the inductance of the inductors I if the inductances are variable) of the capacitive structures RC in the resonators R and the variable capacitances of the cross-coupling capacitive structure CC1. As such, the control output 28 may include one or more analog signals and/or digital signals depending on a topology used to set the capacitive structures RC (and/or the inductors I) in the resonators R and the variable capacitances of the cross-coupling capacitive structure CC1.

More specifically, the control circuit 14 is configured to tune the first tunable RF filter path 24 by adjusting the variable capacitances of the capacitive structures RC1, RC2, RC3, RC4 (and adjusting the inductances of the inductors I1, I2, I3, I4 if variable) and by adjusting the variable capacitances of the cross-coupling capacitive structures CC12, CC23, CC34, so as to provide impedance matching between the first terminal 20 and the second terminal 22 at the first frequency. As mentioned above, the first frequency may be the RF signal frequency of the RF transmit signal TX1 and/or the RF transmit signal RX1. Thus, the first frequency may be provided in the RF communication band that includes the RF transmit signal TX1 and/or the RF transmit signal RX1. The control circuit 14 is configured to tune the second tunable RF filter path 26 by adjusting the variable capacitances of the capacitive structures RC1, RC5, RC6, RC4 (and adjusting the inductances of the inductors I1, I2, I3, I4 if variable) and by adjusting the variable capacitances of the cross-coupling capacitive structures CC15, CC56, CC46, so as to provide impedance matching between the first terminal 20 and the second terminal 22 at the second frequency. As mentioned above, the second frequency may be the RF signal frequency of the RF transmit signal TX2 and/or the RF receive signal RX2. Thus, the second frequency may be provided in another RF communication band that includes the RF transmit signal TX2 and/or the RF receive signal RX2.

With respect to the RF transmit signals TX1, TX2, the second terminal 22 is an input terminal (i.e., source terminal), and the first terminal 20 is an output terminal (e.g., load terminal). The resonator R1 is in both the first subset of the resonators R included in the first tunable RF filter path 24 and in the second subset of the resonators R included in the second tunable RF filter path 26. Furthermore, the resonator R1 is connected to the second terminal 22. Therefore, with respect to transmission, the resonator R1 is coupled in the first tunable RF filter path 24 and the second tunable RF filter path 26 so as to operate as a splitter between the first tunable RF filter path 24 and the second tunable RF filter path 26. For example, the first tunable RF filter path 24 may be tuned by the control circuit 14 to pass the RF transmit signal TX1 and block the RF transmit signal TX2. Additionally, the second tunable RF filter path 26 may be tuned by the control circuit 14 to pass the RF transmit signal TX2 and block the RF transmit signal TX1. As such, the resonator R1 and cross-coupling capacitors CC12, CC15 may be tuned so that the resonator R1 splits the RF transmit signal TX1 and the RF transmit signal TX2. The RF transmit signal TX1 thus propagates toward the first terminal 20 and the antenna 16 along the first tunable RF filter path 24. The RF transmit signal TX2 also propagates toward the first terminal 20 and the antenna 16 but along the second tunable RF filter path 26.

With respect to the RF transmit signals TX1, TX2, the first terminal 20 connected to the antenna is the output terminal (e.g., load terminal). The resonator R4 is also in both the first subset of the resonators R included in the first tunable RF filter path 24 and in the second subset of the resonators R included in the second tunable RF filter path 26. Furthermore, the resonator R4 is connected to the second terminal 22. Therefore, with respect to transmission, the resonator R4 is coupled in the first tunable RF filter path 24 and the second tunable RF filter path 26 so as to operate as a combiner between the first tunable RF filter path 24 and the second tunable RF filter path 26. Thus, prior to the RF transmit signals TX1, TX2 reaching the first terminal 20 and the antenna 16, the RF transmit signal TX1 and the RF transmit signal TX2 are combined by the resonator R4. The RF transmit signals TX1, TX2 are then output from the first terminal 20 and emitted by the antenna 16.

With respect to the RF receive signals RX1, RX2, the first terminal 20 is an input terminal (i.e., source terminal), and the second terminal 22 is an output terminal (e.g., load terminal). The resonator R4 is in both the first subset of the resonators R included in the first tunable RF filter path 24 and in the second subset of the resonators R included in the second tunable RF filter path 26. Furthermore, the resonator R4 is connected to the first terminal 20. Therefore, with respect to reception, the resonator R4 is coupled in the first tunable RF filter path 24 and the second tunable RF filter path 26 so as to operate as a splitter between the first tunable RF filter path 24 and the second tunable RF filter path 26. For example, the first tunable RF filter path 24 may be tuned by the control circuit 14 to pass the RF receive signal RX1 and block the RF receive signal RX2. Additionally, the second tunable RF filter path 26 may be tuned by the control circuit 14 to pass the RF receive signal RX2 and block the RF receive signal RX1. As such, the resonator R4 and cross-coupling capacitors CC34, CC46 may be tuned so that the resonator R4 splits the RF receive signal RX1 and the RF receive signal RX2. The RF receive signal RX1 thus propagates toward the second terminal 22 and the RF transceiver circuitry 18 along the first tunable RF filter path 24. The RF receive signal RX2 also propagates toward the second terminal 22 and the RF transceiver chains, but along the second tunable RF filter path 26.

With respect to the RF receive signals RX1, RX2, the second terminal 22 connected to the RF transceiver circuitry 18 is the output terminal (e.g., load terminal). The resonator R1 is also in both the first subset of the resonators R included in the first tunable RF filter path 24 and in the second subset of the resonators R included in the second tunable RF filter path 26. Furthermore, the resonator R1 is connected to the first terminal 20. Therefore, with respect to reception, the resonator R1 is coupled in the first tunable RF filter path 24 and the second tunable RF filter path 26 so as to operate as a combiner between the first tunable RF filter path 24 and the second tunable RF filter path 26. Thus, prior to the RF receive signals RX1, RX2 reaching the second terminal 22 and the antenna 16, the RF receive signal RX1 and the RF receive signal RX2 are combined by the resonator R1. The RF receive signals RX1, RX2 are then output from the second terminal 22 and processed by the RF transceiver circuitry 18. As such, the RF filter structure 12 may be utilized in applications related to carrier aggregation, frequency division duplexing, and diplexing, in addition to time division duplexing applications.

Figure 2A:
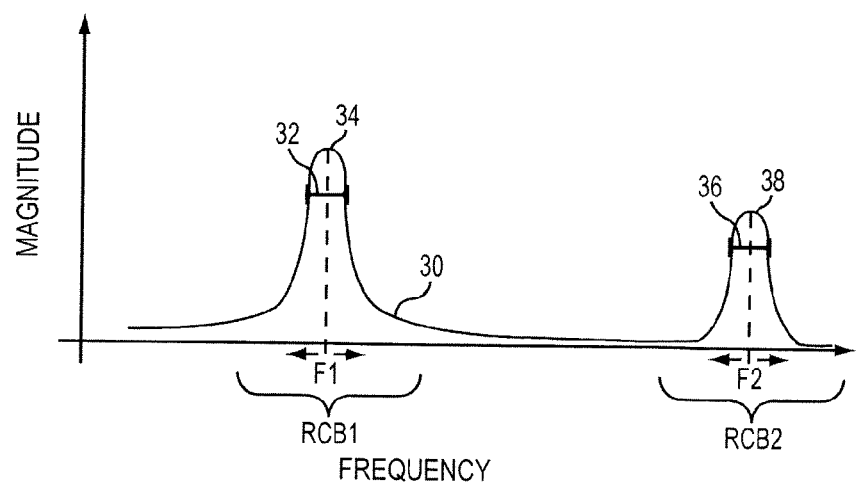
FIG. 2A and FIG. 2B illustrate an exemplary tunable transfer response of the RF filter structure shown in FIG. 1.
Figure 2B:
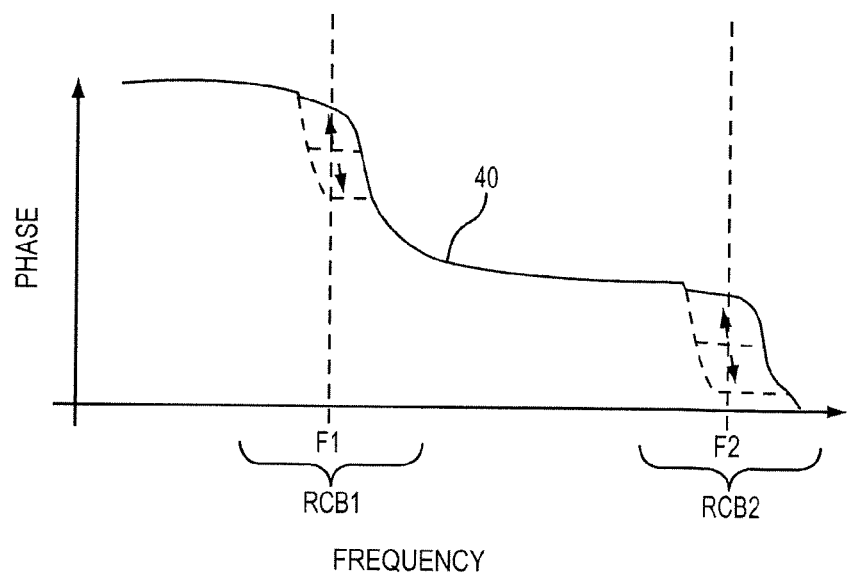

FIGS. 2A and 2B illustrate an exemplary tunable transfer response of the RF filter structure 12 between the first terminal 20 and the second terminal 22 shown in FIG. 1, after the RF filter structure 12 has been tuned by the control circuit 14 (also shown in FIG. 1) to provide impedance matching as explained above. More specifically, FIG. 2A illustrates a tunable amplitude response 30 defined by the tunable transfer response of the RF filter structure 12 between the first terminal 20 and the second terminal 22. As shown in FIG. 2A, the RF filter structure 12 (shown in FIG. 1) is tunable to define a first passband 32 between the first terminal 20 (shown in FIG. 1) and the second terminal 22 (shown in FIG. 1) such that a first frequency F1 is in the first passband 32. The first frequency F1 may be the RF signal frequency of the RF transmit signal TX1 and/or the RF receive signal RX1 defined within an RF communication band RCB1 assigned to the RF transmit signal TX1 and/or the RF receive signal RX1. The first passband 32 corresponds to magnitude values in the tunable amplitude response 30 that are within 3 dB of a maxima 34. In this embodiment, the first tunable RF filter path 24 shown in FIG. 1 is operable to provide the first passband 32. The maxima 34 has been set by the control circuit 14 shown in FIG. 1 so that the maxima 34 is at the first frequency F1. However, the maxima 34 is set by the poles and zeros provided by the resonators R1, R2, R3, R4, and cross-coupling capacitive structures CC12, CC23, CC34 provided within the first tunable RF filter path 24 provided in FIG. 1. Since these can be varied by the control circuit 14, the first passband 32 and the corresponding maxima 34 can be shifted to any desired frequency and RF communication band and the maxima 34 can be adjusted.

Additionally, as shown in FIG. 2A, the RF filter structure 12 (shown in FIG. 1) is tunable to define a second passband 36 between the first terminal 20 (shown in FIG. 1) and the second terminal 22 (shown in FIG. 1) such that a second frequency F2 is in the second passband 36. The second frequency F2 may be the RF signal frequency of the RF transmit signal TX2 and/or the RF receive signal RX2 defined within an RF communication band RCB2 assigned to the RF transmit signal TX2 and/or the RF receive signal RX2. The second passband 36 corresponds to magnitude values in the tunable amplitude response 30 that are within 3 dB of a maxima 38. In this embodiment, the second tunable RF filter path 26 shown in FIG. 1 is operable to provide the second passband 36. The maxima 38 has been set by the control circuit 14 shown in FIG. 1 so that the maxima 38 is at the second frequency F2 and has a prescribed value. However, the maxima 38 is set by the poles and zeros provided by the resonators R1, R5, R6, R4, and cross-coupling capacitive structures CC15, CC56, CC46 provided within the second tunable RF filter path 26 illustrated in FIG. 1. Since these can be varied, the second passband 36 and the corresponding maxima 38 can be shifted to any desired frequency and RF communication band. As such, the control circuit 14 is operable to provide tuning with respect to the first frequency F1 and the second frequency F2 individually using the first tunable RF filter path 24 for the first frequency F1 and the second tunable RF filter path 26 for the frequency F2.

With respect to FIG. 2B, FIG. 2B illustrates a tunable phase response 40 defined by the tunable transfer response of the RF filter structure 12 shown in FIG. 1 between the first terminal 20 and the second terminal 22. As shown in FIG. 2B, the control circuit 14 shown in FIG. 1 is configured to tune the RF filter structure 12 and provide phase adjustments to the tunable phase response 40 at the first frequency F1 within the RF communication band RCB1 and at the second frequency F2 within the RF communication band RCB2 individually.

With respect to the first frequency F1 and the RF communication band RCB1, the control circuit 14 is configured to tune the resonators R1, R2, R3, R4, and cross-coupling capacitive structures CC12, CC23, CC34 provided within the first tunable RF filter path 24 shown in FIG. 1 to adjust a phase of the first tunable RF filter path 24 and therefore a phase value of the tunable phase response 40 at the first frequency F1. Accordingly, by appropriately setting the maxima 34 shown in FIG. 2B at the first frequency F1 and the phase of the first tunable RF filter path 24 at the first frequency F1, the control circuit 14 is configured to tune first tunable RF filter path 24 so that the impedances are substantially matched between the first terminal 20 and the second terminal 22 at the first frequency F1. As a result, the control circuit 14 is configured to tune the first tunable RF filter path 24 to provide impedance matching between the first terminal 20 and the second terminal 22 at the first frequency F1. In some cases, impedance matching may not be desired, but a specific complex impedance may be needed at the first terminal 20 and the second terminal 22.

With respect to the second frequency F2 and the RF communication band RCB2, the control circuit 14 is configured to tune the resonators R1, R5, R6, R4, and cross-coupling capacitive structures CC15, CC56, CC46 provided within the second tunable RF filter path 26 shown in FIG. 1 to adjust a phase of the second tunable RF filter path 26 and therefore a phase value of the tunable phase response 40 at the second frequency F2. Accordingly, by appropriately setting the maxima 38 shown in FIG. 2B at the second frequency F2 and the phase of the second tunable RF filter path 26 at the second frequency F2, the control circuit 14 is configured to tune the second tunable RF filter path 26 so that the impedances are substantially matched between the first terminal 20 and the second terminal 22 at the second frequency F2. As a result, the control circuit 14 is configured to tune the second tunable RF filter path 26 to provide impedance matching between the first terminal 20 and the second terminal 22 at the second frequency F2. Tuning both the amplitude and the phase is equivalent with tuning the complex impedance presented at the terminals 20, 22 at given frequency ranges.

FIGS. 3-9 illustrate different exemplary arrangements of a tunable RF filter path 42 that may be provided in the RF filter structure 12 of the RF front-end circuitry 10 shown in FIG. 1. For example, alternative embodiments of the first tunable RF filter path 24 and/or the second tunable RF filter path 26 shown in FIG. 1 may be provided in the same manner as the different examples of the tunable RF filter path 42 shown in FIGS. 3-9. The first tunable RF filter path 24 and the second tunable RF filter path 26 may both be configured in accordance with one of the exemplary arrangements of the tunable RF filter path 42 shown in FIGS. 3-9. Alternatively, the first tunable RF filter path 24 may be provided in accordance with one of the exemplary arrangements shown in FIGS. 3-9, and the second tunable RF filter path 26 may be provided in accordance with a different one of the arrangements shown in FIGS. 3-9. In still other embodiments, additional tunable RF filter paths may be provided in the RF filter structure 12 in accordance with the different exemplary arrangements of the tunable RF filter path 42 shown in FIGS. 3-9. The control circuit 14 shown in FIG. 1 is configured to tune the tunable RF filter path 42 shown in each of FIGS. 3-9 so as to provide impedance matching between the first terminal 20 and the second terminal 22.

With respect to FIGS. 3-9, FIGS. 3-9 each illustrate an embodiment of the tunable RF filter path 42 having resonators (referred to generically or generally as resonators R), at least one cross-coupling capacitive structure (referred to generically or generally as cross-coupling capacitive structure CC). The tunable RF filter path 42 is connected between the first terminal 20 and the second terminal 22. Direct matching capacitive structures (referred to generically as direct matching capacitive structures DMC) are connected within the tunable RF filter path 42 to help provide impedance matching. The control circuit 14 shown in FIG. 1 is configured to tune the tunable RF filter path 42 shown in FIGS. 3-9 so as to provide impedance matching between the first terminal 20 and the second terminal 22. Again, embodiments of the first tunable RF filter path 24 and/or the second tunable RF filter path 26 shown in FIG. 1 may be provided in the same manner as the different examples of the tunable RF filter path 42 shown in FIGS. 3-9.

In FIGS. 3-9, each of the resonators R may include at least one inductor (referred to generically or generally as the inductors I) and at least one capacitive structure (referred to generically or generally as capacitive structures RC). Each of the inductors I may have an inductance that is fixed or variable as explained in further detail below. Additionally, each of the capacitive structures RC may have a capacitance that is fixed or variable. However, in the particular embodiments illustrated in FIGS. 3-9, each of the capacitive structures RC within the resonators R is operable to provide a variable capacitance. It should be noted that arrangements illustrated in FIGS. 3-9 are illustrative but are not exhaustive of possible arrangements for the tunable RF filter path 42. Any suitable arrangement may be used. In particular, arrangements for the tunable RF filter path 42 and the RF filter structure 12 (shown in FIG. 1) may be in accordance to any of the arrangements described in U.S. Utility patent application Ser. No. 14/298,829 (entitled TUNABLE RF FILTER STRUCTURE FORMED BY A MATRIX OF WEAKLY COUPLED RESONATORS) filed Jun. 6, 2014, which is hereby incorporated by reference in its entirety.

With respect to the arrangements described in FIGS. 3-9, the resonators R in the tunable RF filter path 42 shown in FIGS. 3-9 may be weakly coupled, moderately coupled, strongly coupled, have no mutual coupling at all, or any combination of weak, moderate, strong, or no mutual coupling between the different combinations of the resonators R. Also, energy transfer between two weakly coupled resonators R in the tunable RF filter path 42 may be provided by multiple energy transfer components. For example, energy may be transferred between the resonators R only through mutual magnetic coupling, only through mutual electric coupling, or through both mutual electric coupling and mutual magnetic coupling. Ideally, all of the mutual coupling coefficients are provided as designed, but in practice, the mutual coupling coefficients also are at least partially the result of parasitics. The inductors I of the resonators R may also have mutual magnetic coupling between them. A total mutual coupling between the resonators R is given by the sum of magnetic and electric coupling. In this disclosure, the resonators R are weakly coupled to one another when an energy transfer factor between the resonators R is greater than approximately 0% but less than 10%. If the energy transfer factor is between approximately 10% and 50%, the resonators R are moderately coupled. If the energy transfer factor is above 50%, the resonators R are strongly coupled. If the energy transfer factor is approximately 0%, there is no mutual coupling between the resonators R. Nevertheless, in the particular descriptions for FIGS. 3-9 below, the resonators R may be described specifically as being weakly coupled. While these descriptions for the arrangements in FIG. 3-9 may be propitious in certain RF applications, the descriptions are not to be considered limiting as strong coupling, and/or no mutual coupling may be found to be advantageous in other applications.

Also, the embodiments in FIGS. 3-9 include a certain number of the resonators R. This is simply done in order to help clearly describe particular arrangements of the tunable RF filter path 42 but also should not be considered limiting, since the tunable RF filter path 42 may include any number of resonators R and any number of resonators R may be provided in subpaths (See FIGS. 4-6). For example, the tunable RF filter path 42 may be provided using RF filter structures formed from a matrix of resonators R as described in U.S. Utility patent application Ser. No. 14/298,829 (entitled TUNABLE RF FILTER STRUCTURE FORMED BY A MATRIX OF WEAKLY COUPLED RESONATORS). Finally, note that the resonators R shown in FIGS. 3-9 are each provided as single-ended resonators R. However, the resonators R in FIGS. 3-9 (and in the other Figures of this disclosure including FIG. 1) may also each be provided as differential resonators and/or as different combinations of single-ended and differential resonators. Illustrative examples can be found throughout U.S. Utility patent application Ser. No. 14/298,829 (entitled TUNABLE RF FILTER STRUCTURE FORMED BY A MATRIX OF WEAKLY COUPLED RESONATORS).

Figure 3:
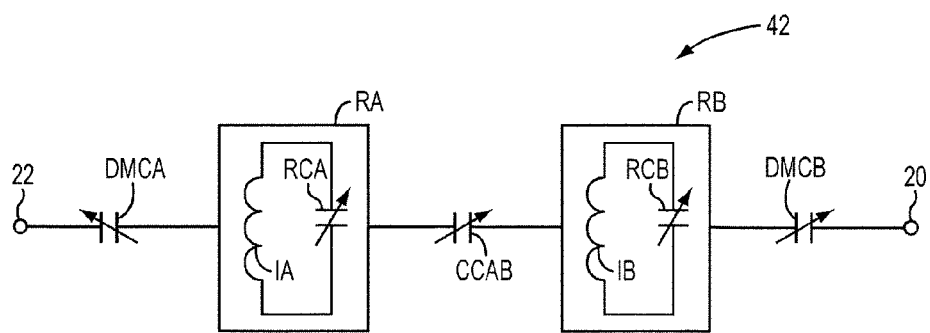
FIG. 3 illustrates an arrangement of a tunable RF filter path.

Referring now specifically to FIG. 3, the tunable RF filter path 42 shown in FIG. 3 includes resonators R (specifically resonators RA and RB), a cross-coupling capacitive structure CC (specifically a cross-coupling capacitive structure CCAB) operable to provide a variable capacitance, and direct matching capacitive structures DMC (specifically direct matching capacitive structures DMCA, DMCB). More specifically, FIG. 3 illustrates a cross-coupling capacitive structure CCAB having a variable capacitance and connected between the resonator RA and the resonator RB. The resonators R have inductors I (specifically as inductors IA-IB) and capacitive structures RC (specifically as capacitive structures RCA-RCB).

A direct matching capacitive structure DMCA is operable to provide a variable capacitance and is connected between the second terminal 22 and the resonator RA. Also, a direct matching capacitive structure DMCB is operable to provide a variable capacitance and is connected between the first terminal 20 and the resonator RB. The control circuit 14 shown in FIG. 1 is configured to adjust the variable capacitances of the capacitive structures RCA, RCB (and the inductances of the inductors IA, IB, if the inductances are variable), adjust the variable capacitance of the cross-coupling capacitive structure CCAB, and adjust the variable capacitances of the direct matching capacitive structures DMCA, DMCB so as to provide impedance matching between the first terminal 20 and the second terminal 22 at a particular frequency.

In one exemplary embodiment, the resonator RA and the resonator RB are weakly coupled to one another. For example, the inductor IA may be weakly magnetically coupled to the inductor IB. Although the resonator RA and the resonator RB are weakly coupled, the inductor IB has a maximum lateral width and a displacement between the inductor IA, and the inductor IB is less than or equal to half the maximum lateral width of the inductor IB. As such, the inductor IA and the inductor IB are relatively close to one another. The displacement between the inductor IA and the inductor IB may be measured from a geometric centroid of the inductor IA to a geometric centroid of the inductor IB. The maximum lateral width may be a maximum dimension of the inductor IB along a plane defined by its largest winding. The weak coupling between the inductor IA and the inductor IB is obtained through topological techniques. For example, the inductor IA and the inductor IB may be fully or partially aligned, where winding(s) of the inductor IA and winding(s) of the inductor IB are configured to provide weak coupling through cancellation. Alternatively or additionally, a plane defining an orientation of the winding(s) of the inductor IA and a plane defining an orientation of the winding(s) of the inductor IB may be fully or partially orthogonal to one another. Some of the magnetic couplings between the resonators R can be unidirectional (passive or active). This can significantly improve isolation (e.g., transmit and receive isolation in duplexers).

With regard to tuning, the control circuit 14 (shown in FIG. 1) is configured to adjust a total mutual coupling factor between the resonator RA and the resonator RB by adjusting the variable capacitance of the cross-coupling capacitive structure CCAB. Additionally, the control circuit 14 (shown in FIG. 1) is configured to adjust the variable capacitances of the direct matching capacitive structures DMCA, DMCB to adjust a phase of the tunable RF filter path 42 at a particular frequency. In this manner, the control circuit 14 (shown in FIG. 1) is configured to tune the tunable RF filter path 42 to provide impedance matching between the first terminal 20 and the second terminal 22 at the particular frequency.

It should be noted that while the tunable RF filter path 42 has two resonators RA, RB, any number of resonators R may be provided in the tunable RF filter path 42 shown in FIG. 3. The exemplary arrangement of the tunable RF filter path 42 is advantageous because it is the simplest arrangement in that it simply includes a direct path. However, this arrangement also makes it more difficult to provide for precise phase adjustments.

Figure 4:
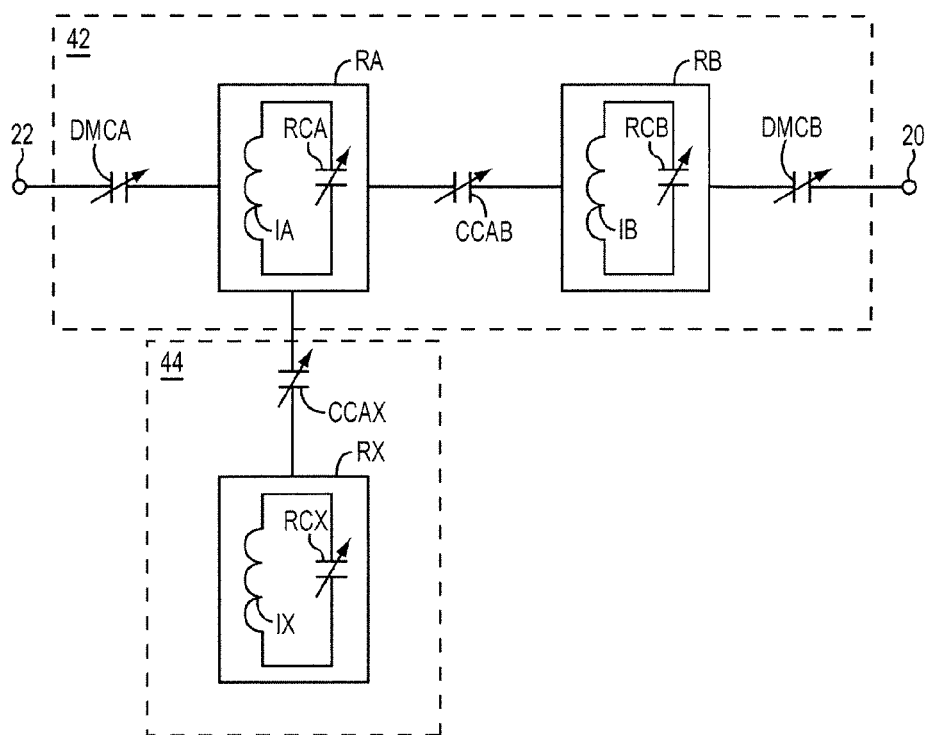
FIG. 4 illustrates an arrangement of the tunable RF filter path connected to a subpath for phase tuning.

FIG. 4 illustrates another exemplary arrangement of the tunable RF filter path 42. The tunable RF filter path 42 shown in FIG. 4 includes the same components as the exemplary arrangement shown in FIG. 3. However, in FIG. 4, a resonator RX is coupled to the resonator RA so as to provide a first subpath 44 connected to the tunable RF filter path 42. The resonator RX includes an inductor IX and a capacitive structure RCX. A cross-coupling capacitive structure CCAX is coupled in the first subpath 44 between the resonator RA and the resonator RX. In this embodiment, the resonator RA and the resonator RX are weakly coupled to one another. The cross-coupling capacitive structure CCAX is operable to provide a variable capacitance. To tune the phase of the tunable RF filter path 42, the control circuit 14 (shown in FIG. 1) is further configured to tune the tunable RF filter path 42 by adjusting the variable capacitance of the cross-coupling capacitive structure CCAX so as to adjust a phase of the tunable RF filter path 42, and provide impedance matching between the first terminal 20 and the second terminal 22 at the particular frequency. Providing the first subpath 44 makes it easier to adjust the phase of the tunable RF filter path 42 with greater accuracy.

Figure 5:
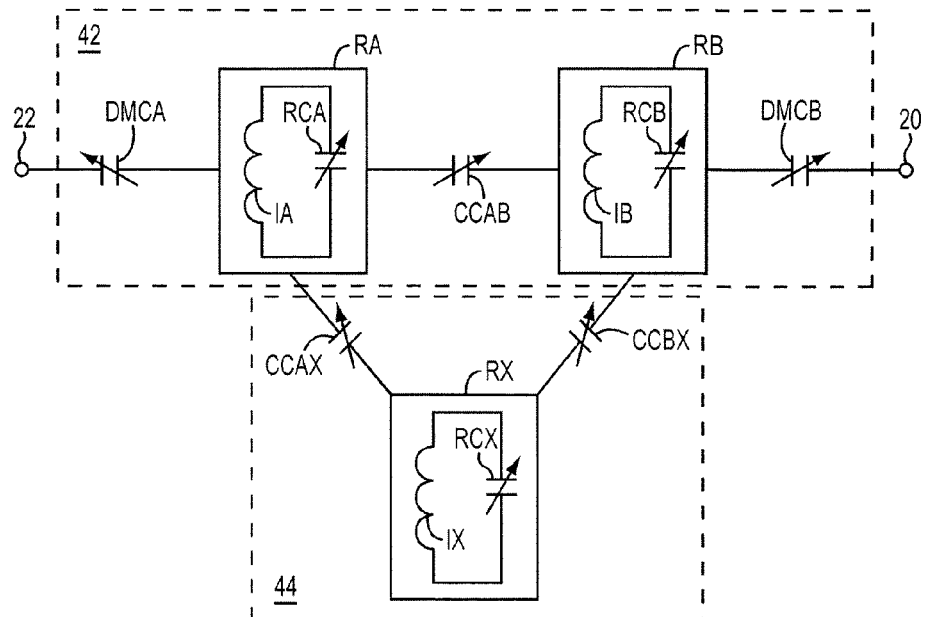
FIG. 5 illustrates an arrangement of the tunable RF filter path connected to a different subpath for phase tuning.

FIG. 5 illustrates still another exemplary arrangement of the tunable RF filter path 42. The tunable RF filter path 42 shown in FIG. 5 includes the same components as the exemplary arrangement shown in FIG. 4. However, in this embodiment, a cross-coupling capacitive structure CCBX is also coupled in the first subpath 44 between the resonator RB and the resonator RX. The cross-coupling capacitive structure CCBX is also operable to provide a variable capacitance. To tune the phase of the tunable RF filter path 42, the control circuit 14 (shown in FIG. 1) is further configured to tune the tunable RF filter path 42 by adjusting the variable capacitance of the cross-coupling capacitive structure CCAX and the variable capacitance of the cross-coupling capacitive structure CCBX. In this manner, the phase of the tunable RF filter path 42 is adjusted to provide impedance matching between the first terminal 20 and the second terminal 22 at the particular frequency.

Figure 6:
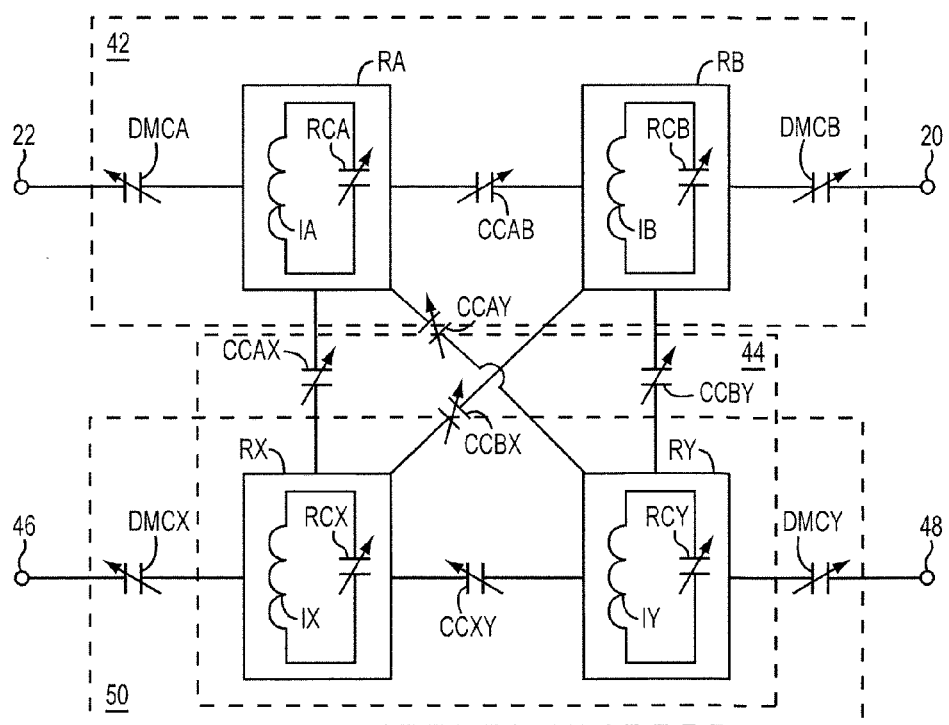
FIG. 6 illustrates an arrangement of the tunable RF filter path connected to a different subpath having multiple resonators for phase tuning.

FIG. 6 illustrates still another exemplary arrangement of the tunable RF filter path 42. The tunable RF filter path 42 shown in FIG. 6 includes the same components as the exemplary arrangement shown in FIG. 5. However, in this embodiment, cross-coupling capacitive structure CCXY, cross-coupling capacitive structure CCBY, cross-coupling capacitive structure CCAY, resonator RY, direct matching capacitive structure DMCX, direct matching capacitive structure DMCY, a third terminal 46, and a fourth terminal 48 are also provided. In this embodiment, the resonators RA, RB, RX, and RY are all weakly coupled to one another. The cross-coupling capacitive structure CCXY is further coupled in the first subpath 44 and is connected between the resonator RX and the resonator RY. In addition, the cross-coupling capacitive CCBY is further coupled in the first subpath 44 and is connected between the resonator RY and the resonator RB. Finally, the cross-coupling capacitive structure CCAY is connected between the resonator RY and the resonator RA. To tune the phase of the tunable RF filter path 42, the control circuit 14 (shown in FIG. 1) is further configured to tune the tunable RF filter path 42 by adjusting the variable capacitance of the cross-coupling capacitive structure CCAX, the variable capacitance of the cross-coupling capacitive structure CCBX, a variable capacitance of the cross-coupling capacitive structure CCXY, a variable capacitance of the cross-coupling capacitive structure CCBY, and a variable capacitance of the cross-coupling capacitive structure CCAY. In this manner, the phase of the tunable RF filter path 42 is adjusted to provide impedance matching between the first terminal 20 and the second terminal 22 at the particular frequency.

Note that in this embodiment another tunable RF filter path 50 is provided between the third terminal 46 and the fourth terminal 48. The tunable RF filter path 50 includes the direct matching capacitive structure DMCX, the resonator RX, the cross-coupling capacitive structure CCXY, the resonator RY and the direct matching capacitive structure DMCY. The direct matching capacitive structure DMCX is connected between the third terminal 46 and the resonator RX. The direct matching capacitive structure DMCY is connected between the resonator RY and the fourth terminal 48. As such, the resonators RA, RB, and the cross-coupling capacitive structures CCAX, CCAB, CCBY can be used to provide a second subpath to adjust the phase of the tunable RF filter path 50.

Figure 7:
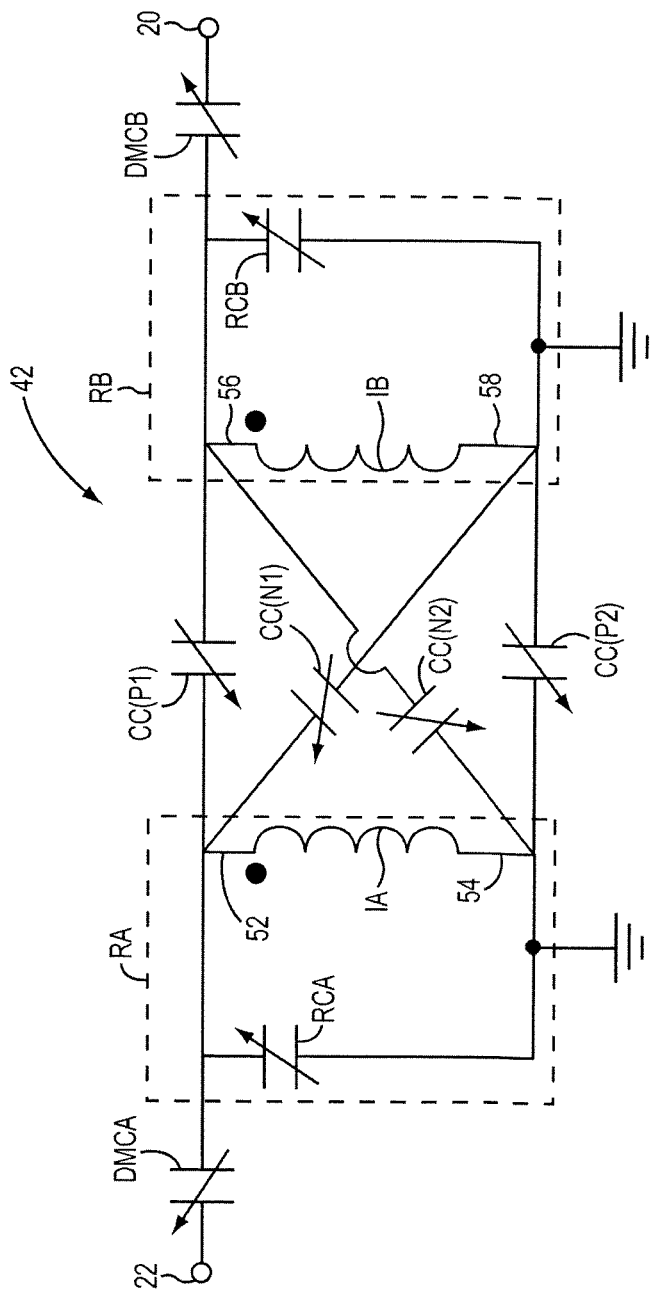
FIG. 7 illustrates an arrangement of the tunable RF filter path with cross-coupling capacitive structures in an X-bridge configuration.

FIG. 7 illustrates an exemplary embodiment of the tunable RF filter path 42 in the RF filter structure 12 shown in FIG. 3. While the exemplary embodiment shown in FIG. 7 is of the tunable RF filter path 42, any of the tunable RF filter paths shown in the RF filter structure 12 of FIG. 3 may be arranged in accordance with the exemplary embodiment shown in FIG. 7. The tunable RF filter path 42 shown in FIG. 7 includes an embodiment of the resonator RA and an embodiment of the resonator RB. The resonator RA and the resonator RB are weakly coupled to one another.

The embodiment of the resonator RA is the same as the embodiment of the resonator RA shown in FIGS. 3-6. Thus, the resonator RA shown in FIG. 7 is a single-ended resonator RA that includes the inductor IA and the capacitive structure RCA. The inductor IA has an end 52 and an end 54, wherein the capacitive structure RCA is connected between the end 52 and the end 54 of the inductor IA. As such, the inductor IA and the capacitive structure RCA are connected in parallel. The direct matching capacitive structure DMCA is connected between the second terminal 22 and the end 52 of the inductor IA. The end 54 of the inductor IA is grounded. Additionally, like the embodiment of the resonator RB shown in FIGS. 3-6 above, the embodiment of the resonator RB shown in FIG. 7 includes the inductor IB and the capacitive structure RCB. The inductor IB has an end 56 and an end 58, wherein the capacitive structure RCB is connected between the end 56 and the end 58 of the inductor IB. Accordingly, the inductor IB and the capacitive structure RCB are also connected in parallel. The end 58 of the inductor IB is grounded. The direct matching capacitive structure DMCB is connected between the first terminal 20 and the end 56 of the inductor IB. Both the capacitive structure RCA and the capacitive structure RCB are grounded.

The resonator RA and the resonator RB are a pair of weakly coupled resonators. In this embodiment, the resonator RA and the resonator RB are weakly coupled by arranging the inductor IA and the inductor IB such that the inductor IA and the inductor IB are weakly magnetically coupled. For example, the inductor IA and the inductor IB may have a (fixed) magnetic coupling coefficient that is less than or equal to approximately 0.3. Although the resonator RA and the resonator RB are weakly coupled, a spatial displacement between the inductor IA and the inductor IB may be less than or equal to half the maximum lateral width of the inductor IB. As such, the inductor IA and the inductor IB are relatively close to one another. The spatial displacement between the inductor IA and the inductor IB may be measured from a geometric centroid of the inductor IA to a geometric centroid of the inductor IB. The maximum lateral width may be a maximum dimension of the inductor IB along a plane defined by its largest winding.

The weak coupling between the inductor IA and the inductor IB may be obtained through topological techniques. In one example, the inductor IA and the inductor IB may be fully or partially aligned, where winding(s) of the inductor IA and winding(s) of the inductor IB are configured to provide weak coupling through magnetic field cancellation. Alternatively or additionally, a plane defining an orientation of the windings of the inductor IA and a plane defining an orientation of the windings of the inductor IB may be fully or partially orthogonal to one another. Alternatively, the inductor IA and inductor IB may be weakly magnetically coupled simply by being sufficiently far apart from one another.

The inductor IA is magnetically coupled to the inductor IB such that an RF signal received at the end 54 of the inductor IA with a voltage polarity (i.e., either a positive voltage polarity or a negative voltage polarity) results in a filtered RF signal being transmitted out the end 56 of the inductor IB with the same voltage polarity. Also, the inductor IB is magnetically coupled to the inductor IA such that an RF signal received at the end 56 of the inductor IB with a voltage polarity (i.e., either a positive voltage polarity or a negative voltage polarity) results in a filtered RF signal being transmitted out the end 52 of the inductor IA with the same voltage polarity. This is indicated in FIG. 7 by the dot convention where a dot is placed at the end 52 of the inductor IA and a dot is placed at the end 56 of the inductor IB.

Since the resonator RA and the resonator RB are weakly coupled, the resonator RB is operably associated with the resonator RA such that an energy transfer factor between the resonator RA and the resonator RB is less than 10%. While the mutual magnetic coupling factor between the inductor IA and the inductor IB is fixed and is less than or equal to approximately 0.3, a total mutual coupling factor is determined not only by the mutual magnetic coupling factor but also by a mutual electric coupling factor. The mutual magnetic coupling factor is provided by the mutual electric coupling between the resonators RA, RB. In this case, the mutual electric coupling factor between the resonators RA, RB can be varied, and the total mutual coupling factor can be varied as well. The mutual electric coupling factor, and thus the total mutual coupling factor between the resonators RA, RB, is varied with cross-coupling capacitive structures CC(P1), CC(P2), CC(N1), and CC(N2) as described in further detail below.

To provide a tuning range to tune a transfer function of the tunable RF filter path 42 and provide a fast roll-off from a low-frequency side to a high-frequency side, the tunable RF filter path 42 should be tunable such that a sign of the total mutual coupling coefficient between the resonator RA and the resonator RB can be changed from positive to negative and vice versa. As shown in FIG. 7, the cross-coupling capacitive structure CC(P1) is electrically connected between the end 52 of the inductor IA within the resonator RA and the end 56 of the inductor IB in the resonator RB so as to provide the positive coupling coefficient (i.e., the variable positive electric coupling coefficient) between the resonator RA and the resonator RB. In other words, a magnitude of the variable positive electric coupling coefficient provided by the cross-coupling capacitive structure CC(P1) is varied by varying the variable capacitance of the cross-coupling capacitive structure. However, the sign of the variable positive electric coupling coefficient is positive. Thus, the variable positive electric coupling coefficient provided by the cross-coupling capacitive structure CC(P1) can also vary the total mutual coupling coefficient between the resonator RA and the resonator RB positively and in accordance with its magnitude.

Also shown in FIG. 7, the cross-coupling capacitive structure CC(P2) is electrically connected between the end 54 of the inductor IA within the resonator RA and the end 58 of the inductor IB in the resonator RB so as to provide another positive coupling coefficient (i.e., another variable positive electric coupling coefficient) between the resonator RA and the resonator RB. In other words, a magnitude of the variable positive electric coupling coefficient provided by the cross-coupling capacitive structure CC(P2) is varied by varying the variable capacitance of the cross-coupling capacitive structure CC(P2). However, the sign of the variable positive electric coupling coefficient is positive. Thus, the variable positive electric coupling coefficient provided by the cross-coupling capacitive structure CC(P2) can vary the total mutual coupling coefficient between the resonator RA and the resonator RB positively and in accordance with its magnitude.

Also in FIG. 7, the cross-coupling capacitive structure CC(N1) is electrically connected between the end 52 of the inductor IA within the resonator RA and the end 58 of the inductor IB in the resonator RB so as to provide a negative coupling coefficient (i.e., a variable negative electric coupling coefficient) between the resonator RA and the resonator RB. In other words, a magnitude of the variable negative electric coupling coefficient provided by the cross-coupling capacitive structure CC(N1) is varied by varying the variable capacitance of the cross-coupling capacitive structure CC(N1). However, the sign of the variable negative electric coupling coefficient is negative. Thus, the variable negative electric coupling coefficient provided by the cross-coupling capacitive structure CC(N1) can vary the total mutual coupling coefficient between the resonator RA and the resonator RB negatively and in accordance with its magnitude.

Finally as shown in FIG. 7, the cross-coupling capacitive structure CC(N2) is electrically connected between the end 54 of the inductor IA within the resonator RA and the end 56 of the inductor IB in the resonator RB so as to provide another negative coupling coefficient (i.e., another variable negative electric coupling coefficient) between the resonator RA and the resonator RB. In other words, a magnitude of the variable negative electric coupling coefficient provided by the cross-coupling capacitive structure CC(N2) is varied by varying the variable capacitance of the cross-coupling capacitive structure CC(N2). However, the sign of the variable negative electric coupling coefficient is negative. Thus, the variable negative electric coupling coefficient provided by the cross-coupling capacitive structure CC(N2) can vary the total mutual coupling coefficient between the resonator RA and the resonator RB negatively and in accordance with its magnitude. By using independent and adjustable positive and negative coupling coefficients, the transfer function of the tunable RF filter path 42 is provided so as to be fully adjustable, and the sign of the total mutual coupling factor between the resonators RA and RB can be changed from positive to negative and vice versa. The arrangement of the cross-coupling capacitive structure CC(P1), the cross-coupling capacitive structure CC(N1), the cross-coupling capacitive structure CC(P2), and the cross-coupling capacitive structure CC(N2) shown in FIG. 7 is an X-bridge structure. In alternative embodiments, any combination of single-ended and/or differential resonators is possible. However, any arrangement may be utilized, such as any of the arrangements described in U.S. Utility patent application Ser. No. 14/298,829 (entitled TUNABLE RF FILTER STRUCTURE FORMED BY A MATRIX OF WEAKLY COUPLED RESONATORS).

Figure 8:
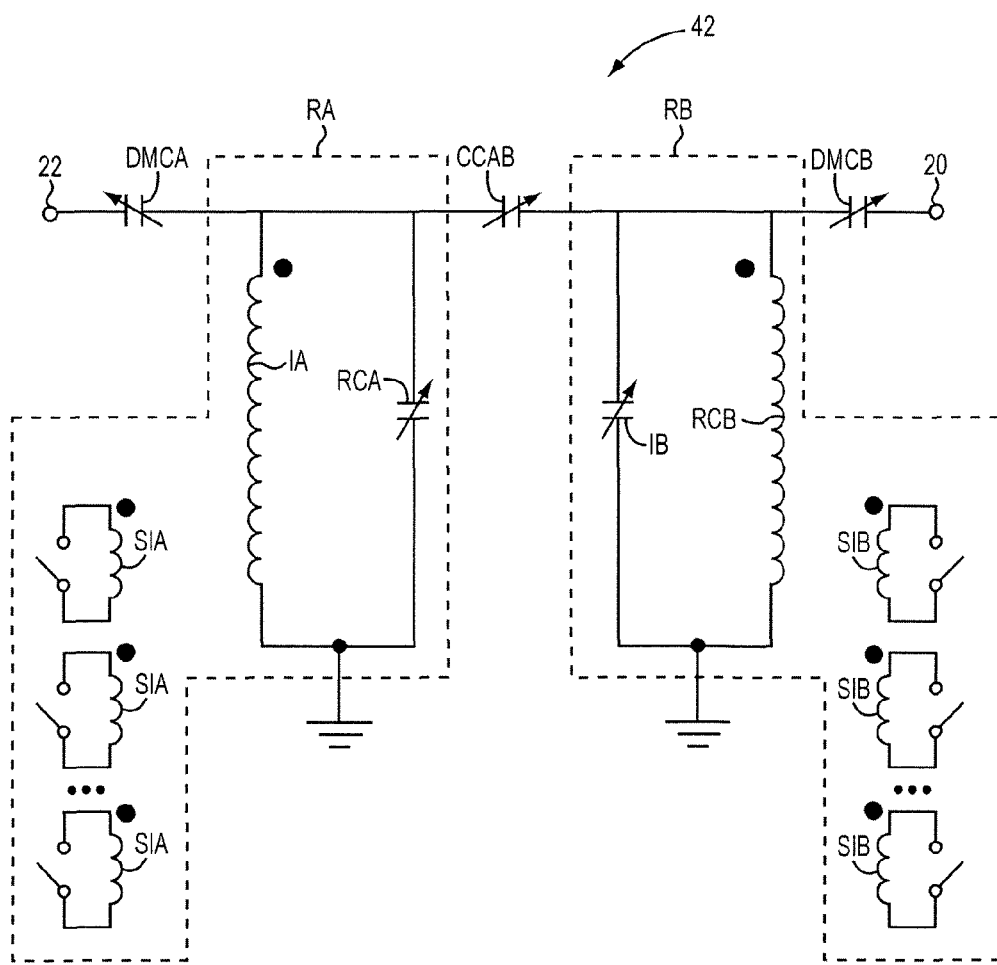
FIG. 8 illustrates an arrangement of the tunable RF filter path with resonators that include switchable inductance elements.

FIG. 8 illustrates still another arrangement of the tunable RF filter path 42. The arrangement of the tunable RF filter path 42 shown in FIG. 8 is similar to the arrangement of the tunable RF filter path 42 shown in FIG. 3. However, in this embodiment, the resonator RA includes a plurality of switchable inductive elements SIA, and the resonator RB includes a plurality of switchable inductive elements SIB. Each of the plurality of switchable inductive elements SIA is configured to be switched so as to be strongly coupled to the inductor IA and adjust an inductance of the resonator RA. More specifically, the control circuit 14 (shown in FIG. 1) is configured to selectively switch any combination of the switchable conductive elements SIA and thereby vary the inductance presented by the resonator RA. This allows for a resonant frequency of the resonator RA to be adjusted by setting the inductance. This allows for the mutual magnetic coupling between the resonator RA and the resonator RB to be adjusted.

Additionally, each of the plurality of switchable inductive elements SIB is configured to be switched so as to be strongly coupled to the inductor IB and adjust an inductance of the resonator RB. More specifically, the control circuit 14 (shown in FIG. 1) is configured to selectively switch any combination of the switchable conductive elements SIB and thereby vary the inductance presented by the resonator RB. This allows for a resonant frequency of the resonator RB to be adjusted by setting the inductance. This allows for the mutual magnetic coupling between the inductor IA and the inductor IB to be varied.

Figure 9:
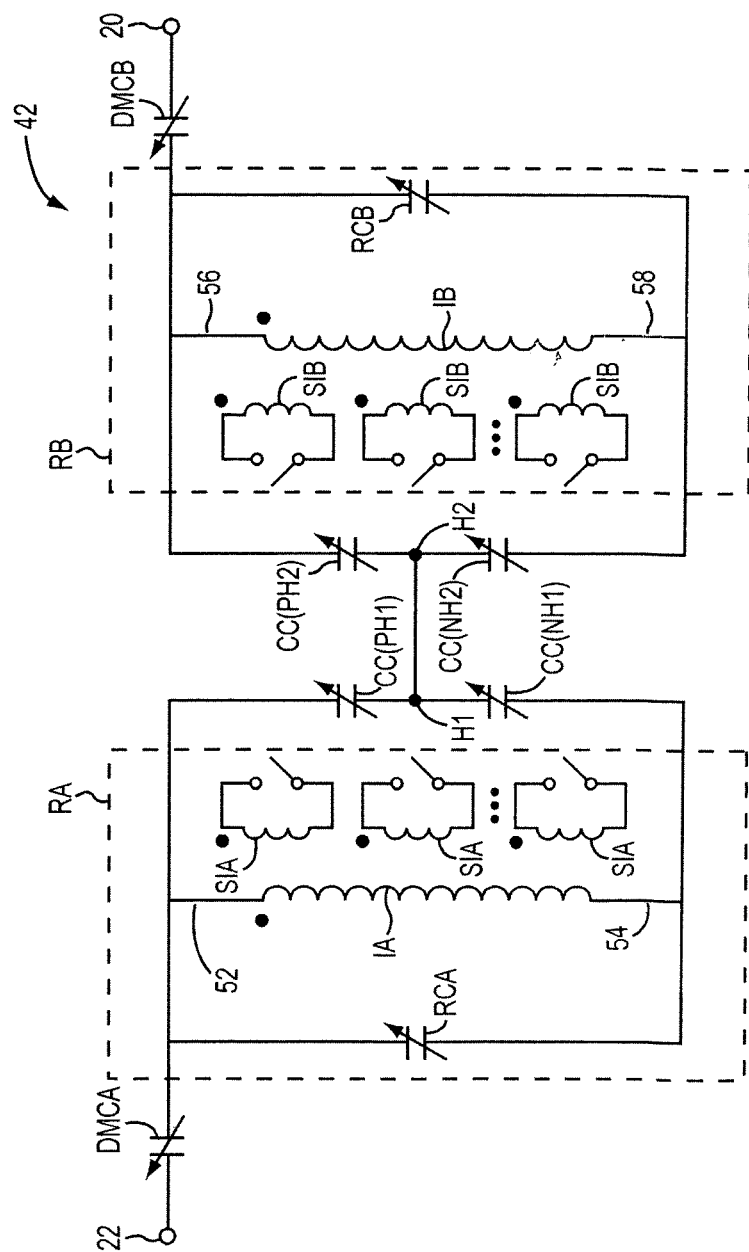
FIG. 9 illustrates an arrangement of the tunable RF filter path with resonators than include switchable inductance elements and cross-coupling capacitive structures in an H-bridge configuration.

FIG. 9 illustrates still another arrangement of the tunable RF filter path 42. The arrangement of the tunable RF filter path 42 shown in FIG. 9 includes the resonator RA and the resonator RB shown in FIG. 8. The tunable RF filter path 42 shown in FIG. 9 includes an embodiment of the resonator RA and an embodiment of the resonator RB. However, in this the arrangement shown in FIG. 9, the tunable RF filter path 42 shown in FIG. 9 includes a cross-coupling capacitive structure CC(PH1), a cross-coupling capacitive structure (CNH1), a cross-coupling capacitive structure CC(PH2), and a cross-coupling capacitive structure CC(NH2). The cross-coupling capacitive structure CC(PH1) and the cross-coupling capacitive structure CC(NH1) are arranged to form a first capacitive voltage divider. The first capacitive voltage divider is electrically connected to the resonator RA. More specifically, the cross-coupling capacitive structure CC(PH1) is electrically connected between the end 52 of the inductor IA and a common connection node H1. The cross-coupling capacitive structure CC(NH1) is electrically connected between the end 54 of the inductor IA and the common connection node H1. Additionally, the cross-coupling capacitive structure CC(PH2) and the cross-coupling capacitive structure CC(NH2) are arranged to form a second capacitive voltage divider. The second capacitive voltage divider is electrically connected to the resonator RB. More specifically, the cross-coupling capacitive structure CC(PH2) is electrically connected between the end 56 of the inductor IB and a common connection node H2. The cross-coupling capacitive structure CC(NH2) is electrically connected between the end 58 of the inductor IB and the common connection node H2. As shown in FIG. 9, the common connection node H1 is electrically connected to the common connection node H2. Thus, in this embodiment, there is a short between the common connection node H1 and the common connection node H2. The common connection nodes H1, H2 may be grounded. Alternatively, a high impedance to ground may be provided at the common connection nodes H1, H2.

The arrangement of the cross-coupling capacitive structure CC(PH1), the cross-coupling capacitive structure CC(NH1), the cross-coupling capacitive structure CC(PH2), and the cross-coupling capacitive structure CC(NH2) shown in FIG. 9 is an H-bridge structure. In an alternative H-bridge structure, an additional cross-coupling capacitive structure is connected between the common connection node H1 and the common connection node H2. In the alternative H-bridge structure, the additional cross-coupling capacitive structure connected between the common connection node H1 and the common connection node H2 may be a variable cross-coupling capacitive structure configured to vary a first variable intermediate electric coupling coefficient provided between the common connection node H1 and the common connection node H2.

With regard to the first capacitive voltage divider specifically shown in FIG. 9, the cross-coupling capacitive structure CC(PH1) is a variable cross-coupling capacitive structure configured to vary a first variable positive electric coupling coefficient provided between the resonator RA and the common connection node H1. The cross-coupling capacitive structure CC(NH1) is a variable cross-coupling capacitive structure configured to vary a first variable negative electric coupling coefficient provided between the resonator RA and the common connection node H1. Thus, a mutual electric coupling coefficient of the resonator RA is approximately equal to the first variable positive electric coupling coefficient and the first variable negative electric coupling coefficient.

With regard to the second capacitive voltage divider, the cross-coupling capacitive structure CC(PH2) is a variable cross-coupling capacitive structure configured to vary a second variable positive electric coupling coefficient provided between the resonator RB and the common connection node H2. The cross-coupling capacitive structure CC(NH2) is a variable cross-coupling capacitive structure configured to vary a second variable negative electric coupling coefficient provided between the resonator RB and the common connection node H2. Thus, a mutual electric coupling coefficient of the resonator RB is approximately equal to the second variable positive electric coupling coefficient and the second variable negative electric coupling coefficient. The tunable RF filter path 42 shown in FIG. 9 thus has a total mutual coupling coefficient between the resonator RA and the resonator RB equal to the sum total of the mutual magnetic coupling coefficient between the inductor IA and the inductor IB, the mutual electric coupling coefficient of the resonator RA, the mutual electric coupling coefficient of the resonator RB, and the first variable intermediate electric coupling coefficient provided between the common connection node H1 and the common connection node H2. In alternative embodiments, cross-coupling capacitive structures with fixed capacitances are provided.

In one embodiment, the cross-coupling capacitive structure CC(PH1), the cross-coupling capacitive structure CC(NH1), the cross-coupling capacitive structure CC(PH2), and the cross-coupling capacitive structure CC(NH2) may each be provided as a varactor. However, the cross-coupling capacitive structure CC(PH1), the cross-coupling capacitive structure CC(NH1), the cross-coupling capacitive structure CC(PH2), and the cross-coupling capacitive structure CC(NH2) may each be provided as a programmable array of capacitors in order to reduce insertion losses and improve linearity. The cross-coupling capacitive structure CC(PH1), the cross-coupling capacitive structure CC(NH1), the cross-coupling capacitive structure CC(PH2), and the cross-coupling capacitive structure CC(NH2) can also be any combination of suitable variable cross-coupling capacitive structures, such as combinations of varactors and programmable arrays of capacitors.

FIG. 10 illustrates yet another embodiment of the RF front-end circuitry 10 and the RF filter structure 12. The RF filter structure 12 includes a plurality of resonators (referred to generically as elements R and specifically as elements R(i,j), where an integer i indicates a row position and an integer j indicates a column position, where $1 \leq i \leq M$, $1 \leq j \leq N$, and M is any integer greater than 1 and N is any integer greater than to 1). The tunable RF filter structure 12 includes an embodiment of the first tunable RF filter path 24 and the second tunable RF filter path 26. It should be noted that in alternative embodiments the number of resonators R in each row and column may be the same or different. The first tunable RF filter path 24 includes row 1 of weakly coupled resonators R(1,1), R(1,2) through R(1,N). The resonators R(1,1), R(1,2) through R(1,N) may be weakly coupled to one another. Furthermore, the first tunable RF filter path 24 is electrically connected between the first terminal 20 and second terminal 22. In this manner, the first tunable RF filter path 24 is configured to be tunable to provide impedance matching between the first terminal 20 and the second terminal 22. The antenna 16 is connected to the first terminal 20. The second tunable RF filter path 26 includes resonators R(1,1), R(2,1) R(2,2), and resonator R(1,N). The resonators R(1,1), R(2,1) R(2,2), and resonator R(1,N) may be weakly coupled also. The second tunable RF filter path 26 thus is also connected between the first terminal 20 and the second terminal 22. The second tunable RF filter path 26 is also configured to be tunable to provide impedance matching between the first terminal 20 and the second terminal 22. Alternatively, tuning is provided to a given complex impedance value.

It should be noted that the RF filter structure 12 may include any number of tunable RF filter paths, such as, for example, a third tunable RF filter path 60, a fourth tunable RF filter path 62, a fifth tunable RF filter path 64, a sixth tunable RF filter path 66. Each of the resonators R may be a tunable resonator, which allows for a resonant frequency of each of the resonators R to be varied to along a frequency range. In some embodiments, not all of the couplings between the resonators R are weak. Hybrid architectures with different combinations of strong, weak, and no mutual coupling are also possible between the resonators R.

Sets [referred to generically or generally as set S and specifically as sets S(1), S(2), S(3), S(4), S(5), and S(6)] of cross-coupled capacitive structures are electrically connected between the resonators R. Each of the sets S(1), S(2), S(3), S(4), S(5), and S(6) is arranged like the set of cross-coupled capacitive structures CCAB, CCAX, CCAY, CCBX, CCBY, CCXY described above with respect to FIG. 6. For example, in one particular exemplary embodiment (e.g., when M=4 and N=3), the set S(1) of cross-coupled capacitive structures is electrically connected between the resonators R(1,1), R(1,2) in the first tunable RF filter path 24 and the resonators R(2,1), R(2,2) in the third tunable RF filter path 60. The set S(2) of cross-coupled capacitive structures is electrically connected between the resonators R(1,2), R(1,N) in the first tunable RF filter path 24 and the resonators R(2,2), R(2,N) in the third tunable RF filter path 60. The set S(3) of cross-coupled capacitive structures is electrically connected between the resonators R(2,1), R(2,2) in the third tunable RF filter path 60 and the resonators R(3,1), R(3,2) in the fourth tunable RF filter path 62. The set S(4) of cross-coupled capacitive structures is electrically connected between the resonators R(2,2), R(2,N) in the third tunable RF filter path 60 and the resonators R(3,2), R(3,N) in the fourth tunable RF filter path 62. The set S(5) of cross-coupled capacitive structures is electrically connected between the resonators R(3,1), R(3,2) in the fourth tunable RF filter path 62 and the resonators R(M,1), R(M,2) in the fifth tunable RF filter path 64. Finally, the set S(6) of cross-coupled capacitive structures is electrically connected between the resonators R(3,2), R(3,N) in the fourth tunable RF filter path 62 and the resonators R(M,2), R(M,N) in the fifth tunable RF filter path 64. Note that some cross-coupled capacitive structures in the sets S(1), S(2), S(3), S(4), S(5), and S(6) of cross-coupled capacitive structures for the resonators R in adjacent columns or in adjacent ones rows overlap. This is because in the matrix of the resonators R, each of the resonators R is adjacent to multiple other ones of the resonators R. In another embodiment, the sets S(1), S(2), S(3), S(4), S(5), and S(6) of cross-coupled capacitive structures may be connected between non-adjacent resonators R. For example, there may be cross-coupled capacitive structures between resonators R that are more than one column or row apart.

The RF filter structure 12 includes the resonators R, which may each be single-ended resonators or differential resonators. The resonators R of the RF filter structure 12 shown in FIG. 10 are arranged as a two-dimensional matrix of the resonators R. The third tunable RF filter path 60 includes row 2 of weakly coupled resonators R(2,1), R(2,2) through R(2,N). All of the weakly coupled resonators R(2,1), R(2,2) through R(2,N) are weakly coupled to one another. Furthermore, the third tunable RF filter path 60 is electrically connected between third terminal 46 and fourth terminal 48. In this manner, the third tunable RF filter path 60 is configured tunable to provide impedance matching between the third terminal 46 and the fourth terminal 48. An antenna 72 is connected to the fourth terminal 48. In this manner, the third tunable RF filter path 60 is configured to receive RF signals and output filtered RF signals.

With regard to the fourth tunable RF filter path 62, the fourth tunable RF filter path 62 includes a resonator R(3,1), a resonator R(3,2), and one or more additional resonators R, such as a resonator R(3,N), since the integer N is 3 or greater. All of the weakly coupled resonators R(3,1) through R(3,N) are weakly coupled to one another. Alternatively, only a proper subset of them may be weakly coupled to one another. All of the weakly coupled resonators R(2,1), R(2,2) through R(2,N) are weakly coupled to one another. Furthermore, the fourth tunable RF filter path 62 is electrically connected between a fifth terminal 74 and sixth terminal 76. The sixth terminal 76 is connected to an antenna 78. In this manner, the third tunable RF filter path 60 is configured tunable to provide impedance matching between the fifth terminal 74 and the sixth terminal 76.

With regard to the fifth tunable RF filter path 64, the fifth tunable RF filter path 64 includes the resonator R(M,1), the resonator R(M,2), and one or more additional resonators R, such as the resonator R(M,N), since the integer N is 3 or greater. All of the weakly coupled resonators R(M,1) through R(M,N) are weakly coupled to one another. Alternatively, only a proper subset of them may be weakly coupled to one another. Furthermore, the fifth tunable RF filter path 64 is electrically connected between a seventh terminal 80 and an eighth terminal 82. An antenna 84 is connected to the eighth terminal 82. In this manner, the fifth tunable RF filter path 64 is configured to be tunable to provide impedance matching between the seventh terminal 80 and the eighth terminal 82.

With regard to the sixth tunable RF tunable path 66, the fifth tunable RF filter path 64 includes the resonator R(2,1), the resonator R(2,2), the resonator R(2,N) and the resonator R(1,N). All of the weakly coupled resonators the resonator R(2,1), the resonator R(2,2), the resonator R(2,N) and the resonator R(1,N) are weakly coupled to one another. Alternatively, only a proper subset of them may be weakly coupled to one another. Furthermore, the sixth tunable RF tunable path 66 is electrically connected between the third terminal 46 and the first terminal 20. In this manner, the sixth tunable RF tunable path 66 is configured to be tunable to provide impedance matching between the third terminal 46 and the first terminal 20.

The second terminal 22, the third terminal 46, the fifth terminal 74, and the seventh terminal 80 are each connected to the RF transceiver circuitry 18. Clearly, the number of possible filter paths that can be provided by the RF filter structure 12 is extremely great and need not be described here. However, with regards to any of these RF filter paths (including the first tunable RF filter path 24, the second tunable RF filter path 26, the third tunable RF filter path 60, the fourth tunable RF filter path 62, the fifth tunable RF filter path 64, the sixth tunable RF filter path 66) to provide impedance matching between any combination of the second terminal 22, the third terminal 46, the fifth terminal 74, and the seventh terminal 80 connected to the RF transceiver circuitry 18 and the first terminal 20, the fourth terminal 48, the sixth terminal 76, and the eighth terminal 82 connected to the antennas 16, 72, 78, 84 at desired frequencies. Accordingly, the RF filter structure 12 can thus be used to provide impedance tuning during Multiple Input Multiple Output (MIMO), Single Input Multiple Output (SIMO), Multiple Input Single Output (MISO), and Single Input Single Output (SISO) operations. The RF filter structure 12 can also be used to provide multiplexing, carrier aggregation, frequency division duplexing, time division duplexing, and the like as further described in U.S. Utility patent application Ser. No. 14/298,829 (entitled TUNABLE RF FILTER STRUCTURE FORMED BY A MATRIX OF WEAKLY COUPLED RESONATORS).

Figure 11:
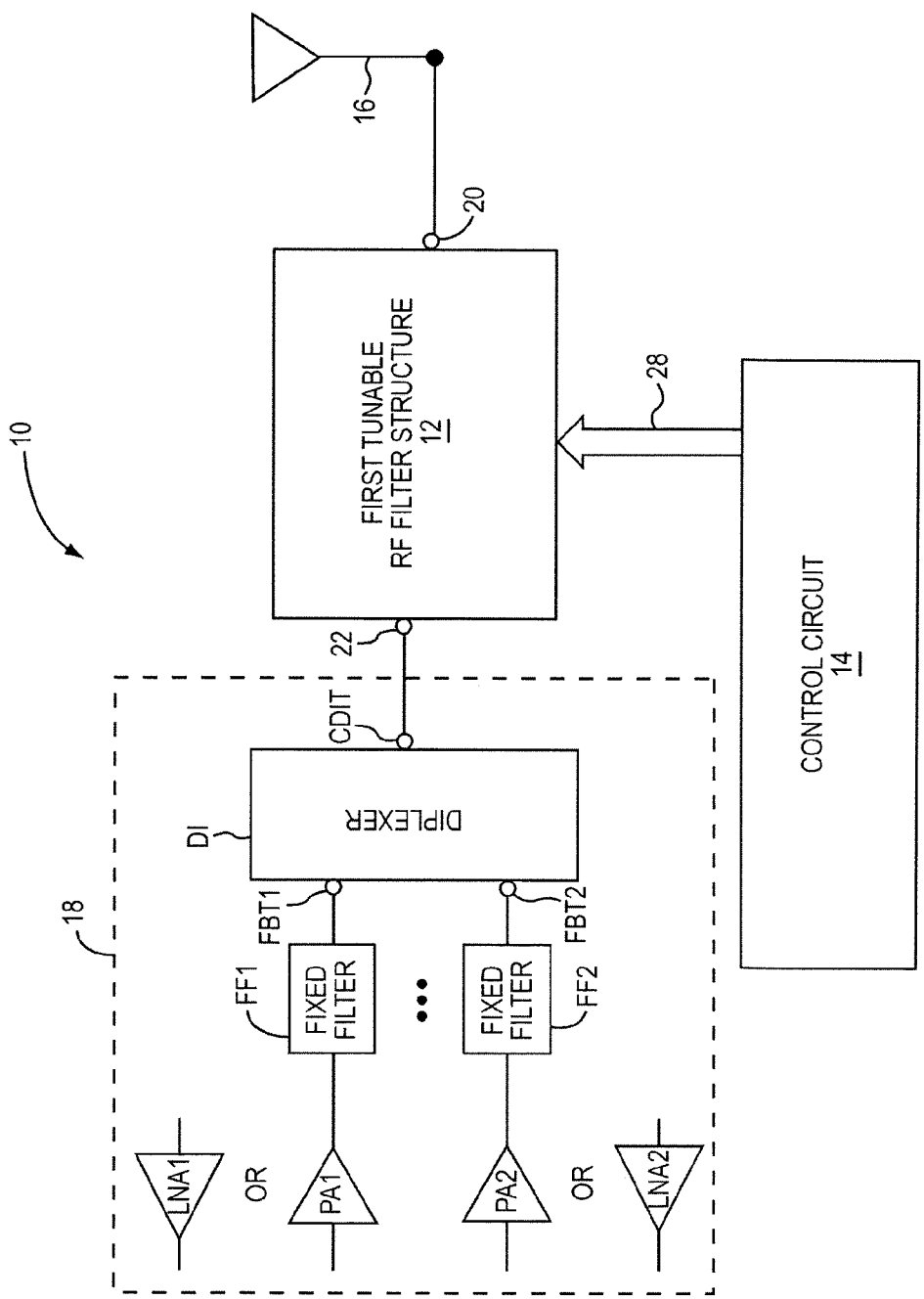
FIG. 11 illustrates an embodiment of the RF front-end circuitry with RF transceiver circuitry and the RF filter structure shown in FIG. 10.

FIG. 11 illustrates another embodiment of RF front-end circuitry 10 and an implementation of the RF filter structure 12 shown in FIG. 10. As shown in FIG. 11, the RF transceiver circuitry 18 includes a power amplifier (PA1) or a low noise amplifier (LNA1) along with a fixed filter (FF1) connected to a first band terminal FBT1 of a diplexer DI. The power amplifier PA1 and the low-noise amplifier LNA1 may be part of a transceiver chain that operates within a first frequency band. The RF transceiver circuitry 18 also includes a power amplifier (PA2) or a low noise amplifier (LNA2) along with a fixed filter (FF2) connected to a second band terminal FBT2 of the diplexer DI. Duplex can also be provided The power amplifier PA2 or the low-noise amplifier LNA2 may be part of a transceiver chain that operates within a second frequency band.

A common terminal CDIT of the diplexer DI (or a duplexer) is connected to the second terminal 22. In this manner, the first tunable RF filter path 24 (shown in FIG. 10) may be configured to be tunable to provide impedance matching between the first terminal 20 and the second terminal 22 at a first frequency within the first frequency band associated with the power amplifier PA1 or the low-noise amplifier LNA1. The second tunable RF filter path 26 (shown in FIG. 10) may be configured to be tunable to provide impedance matching between the first terminal 20 and the second terminal 22 at a second frequency within the second frequency band associated with the power amplifier PA2 or the low-noise amplifier LNA2. The control circuit 14 may be configured to tune the first tunable RF filter path 24 and the second tunable RF filter path 26 accordingly. In this way, the RF front-end circuitry 10 can have optimal performance while operating simultaneously in one or more bands (e.g., carrier aggregation).

Figure 12:
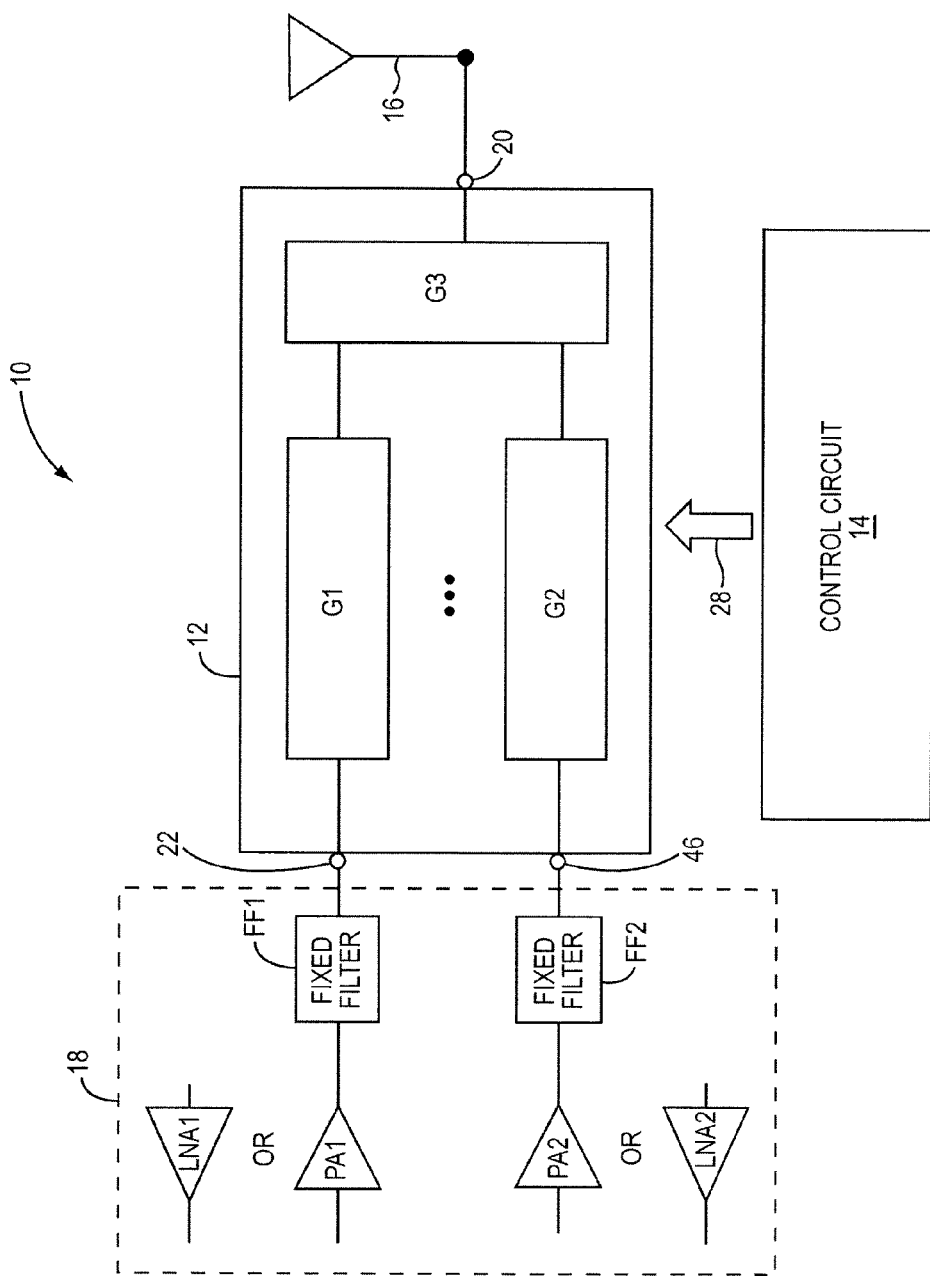
FIG. 12 illustrates an embodiment of the RF front-end circuitry with the RF filter structure shown in FIG. 10, wherein a group of resonators in the RF filter structure is used to provide diplexing at a terminal connected to the antenna and other groups of resonators in the RF filter structure are used to provide impedance matching.

FIG. 12 illustrates another embodiment of RF front-end circuitry 10 and an implementation of the RF filter structure 12 shown in FIG. 10. As shown in FIG. 12, the RF transceiver circuitry 18 includes the power amplifier PA1 or the low noise amplifier LNA1 along with the fixed filter FF1. However, in this embodiment, the fixed filter FF1 is connected to the second terminal 22. The RF transceiver circuitry 18 also includes the power amplifier PA2 or the low noise amplifier LNA2 along with the fixed filter FF2. However, in this embodiment, the fixed filter FF2 is connected to the third terminal 46. The first tunable RF filter path 24 (shown in FIG. 10) provides a path from the power amplifier PA1 or the low-noise amplifier LNA1 to the antenna 16. In this manner, the first tunable RF filter path 24 (shown in FIG. 10) may be configured to be tunable to provide impedance matching between the first terminal 20 and the second terminal 22 at a first frequency within the first frequency band associated with the power amplifier PA1 or the low-noise amplifier LNA1. The sixth tunable RF filter path 66 (shown in FIG. 10) provides a path from the power amplifier PA2 or the low-noise amplifier LNA2 to the antenna 16. The sixth tunable RF filter path 66 (shown in FIG. 10) may be configured to be tunable to provide impedance matching between the first terminal 20 and the third terminal 46 at a second frequency within the second frequency band associated with the power amplifier PA2 or the low-noise amplifier LNA2.

The control circuit 14 may be configured to tune the first tunable RF filter path 24 and the sixth tunable impedance path 66 accordingly. More specifically, a group G1 of one or more of the resonators (e.g., the resonators R(1,1), R(1,2) shown in FIG. 10) in the first tunable RF filter path 24 may be tuned by the control circuit 14 specifically to provide impedance matching between the first terminal 20 and the second terminal 22. A group G2 of one or more of the resonators (e.g., the resonators R(2,1), R(2,2), R(2,N) shown in FIG. 10) in the sixth tunable RF filter path 66 may be tuned by the control circuit 14 specifically to provide impedance matching between the first terminal 20 and the third terminal 46. Finally, a group G3 of one or more resonators (e.g., R(1,N) in the first tunable RF filter path 24 and/or the sixth tunable RF filter path 66 may be tuned by the control circuit 14 to provide diplexing/duplexing (combining or splitting) at the first terminal 20.

FIG. 13 illustrates another embodiment of RF front-end circuitry 10 and an implementation of the RF filter structure 12 shown in FIG. 10. As shown in FIG. 12, the RF transceiver circuitry 18 includes the power amplifier PA1 or the low noise amplifier LNA1. However, in this embodiment, the power amplifier PA1 or the low noise amplifier LNA1 is connected to the second terminal 22. The first tunable RF filter path 24 (shown in FIG. 10) provides a path from the power amplifier PA1 or the low-noise amplifier LNA1 to the antenna 16. In this manner, the first tunable RF filter path 24 (shown in FIG. 10) may be configured to be tunable to provide impedance matching between the first terminal 20 and the second terminal 22 at a first frequency within the first frequency band associated with the power amplifier PA1 or the low-noise amplifier LNA1. The second tunable RF filter path 26 (shown in FIG. 10) provides another path from the power amplifier PA1 or the low-noise amplifier LNA1 to the antenna 16. If there is carrier aggregation and/or frequency division multiplexing being provided by the RF transceiver circuitry 18, the power amplifier PA2 or the low noise amplifier LNA2 may also be coupled to the second terminal 22. The second tunable RF filter path 26 (shown in FIG. 10) may be configured to be tunable to provide impedance matching between the first terminal 20 and the second terminal 22 at the second frequency within the second frequency band associated with the power amplifier PA2 or the low-noise amplifier LNA2.

The control circuit 14 may be configured to tune the first tunable RF filter path 24 and the second tunable RF filter path 26 accordingly. More specifically, a group G4 of one or more of the resonators (e.g., the resonator R(1,1), shown in FIG. 10) in the first tunable RF filter path 24 and/or the second tunable RF filter path 26 may be tuned by the control circuit 14 specifically to provide diplexing (combining and/or splitting) at the second terminal. A group G5 of one or more of the resonators (e.g., resonator R(1,2) in the first tunable RF filter path 24 may be tuned by the control circuit 14 specifically to provide additional filtering by the first tunable RF filter path 24. A group G6 of one or more of the resonators (e.g., resonator R(2,1) in the second tunable RF filter path 26 may be tuned by the control circuit 14 specifically to provide additional filtering by the second tunable RF filter path 26. A group G7 of one or more of the resonators (e.g., a resonator R(1,3) which is not explicitly shown in FIG. 10) in the first tunable RF filter path 24 may be tuned by the control circuit 14 specifically to provide impedance matching between the first terminal 20 and the second terminal 22 at the first frequency within the first frequency band. A group G8 of one or more of the resonators (e.g., the resonator R(2,2) shown in FIG. 10) in the second tunable RF filter path 26 may be tuned by the control circuit 14 specifically to provide impedance matching between the first terminal 20 and the second terminal 22. Finally, a group G9 of one or more resonators (e.g., R(1,N) in the first tunable RF filter path 24 and/or the second tunable RF filter path 26 may be tuned by the control circuit 14 to provide diplexing (combining and/or splitting) at the first terminal 20.

FIG. 14 illustrates a hybrid coupler 86 having an input terminal 88, a first quadrature terminal 90, a second quadrature terminal 92, and an isolation terminal 94. In this embodiment, the tunable RF filter path 42 is connected to the isolation terminal 94 and is tunable to provide impedance tuning for the hybrid coupler 86. It should be noted that the tunable RF filter path 42 may be any tunable RF filter path described in this disclosure including any of the arrangements of the tunable RF filter path 42 shown in FIGS. 4-9. The control circuit 14 is configured to tune the tunable RF filter path 42 to provide impedance matching for the hybrid coupler 86. While the tunable RF filter path 42 shown in FIG. 14 is connected to the isolation terminal 94, the tunable RF filter path 42 may also be connected to the input terminal 88, the first quadrature terminal 90, the second quadrature terminal 92, and the isolation terminal 94.

FIG. 15 illustrates a directional coupler 96 having an input terminal 98, an output terminal 100, a coupled terminal 102, and an isolation terminal 104. In this embodiment, the tunable RF filter path 42 is connected to the isolation terminal 104 and is tunable to provide impedance tuning for the directional coupler 96. It should be noted that the tunable RF filter path 42 may be any tunable RF filter path described in this disclosure including any of the arrangements of the tunable RF filter path 42 shown in FIGS. 4-9. The control circuit 14 is configured to tune the tunable RF filter path 42 to provide impedance tuning for the directional coupler 96. While the tunable RF filter path 42 shown in FIG. 14 is connected to the isolation terminal 104, the tunable RF filter path 42 may also be connected to the input terminal 98, the output terminal 100, the coupled terminal 102, and the isolation terminal 104. The control circuit 14 receives a feedback signal 106 from the coupled terminal 102. In this manner, the control circuit 14 may be configured to tune the tunable RF filter path 42 so as to provide impedance tuning for the directional coupler 96 in accordance with the feedback signal 106. Since the feedback signal 106 is connected to the coupled terminal 102, the feedback signal 106 indicates forward power from the input terminal 98 to the output terminal 100.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) filter structure, comprising:
a first terminal;
a second terminal;
a first tunable RF filter path defined between the first terminal and the second terminal, wherein the first tunable RF filter path is configured to be tunable to provide impedance matching between the first terminal and the second terminal at a first frequency and wherein the first tunable RF filter path comprises a first subset of the plurality of resonators wherein at least a pair of the first subset of the plurality of resonators are weakly coupled to one another;
a second tunable RF filter path defined between the first terminal and the second terminal, wherein the second tunable RF filter path is configured to be tunable to provide impedance matching between the first terminal and the second terminal at a second frequency and wherein the second tunable RF filter path comprises a second subset of the plurality of resonators; and
wherein the first subset of the plurality of resonators and the second subset of the plurality of resonators are not mutually exclusive.

2. The RF filter structure of claim 1 wherein the RF filter structure has a tunable transfer response and is further tunable to:
define a first passband between the first terminal and the second terminal such that the first frequency is in the first passband;
define a second passband between the first terminal and the second terminal such that the second frequency is in the second passband.

3. The RF frequency filter structure of claim 1 wherein the first subset of the plurality of resonators and the second subset of the plurality of resonators both include a first resonator coupled to the first terminal, the first resonator being coupled in the first tunable RF filter path and the second tunable RF filter path so as to operate as a splitter between the first tunable RF filter path and the second tunable RF filter path.

4. The RF frequency filter structure of claim 3 wherein the first subset of the plurality of resonators and the second subset of the plurality of resonators both include a second resonator coupled to the second terminal, the second resonator being coupled in the first tunable RF filter path and the second tunable RF filter path so as to operate as a combiner between the first tunable RF filter path and the second tunable RF filter path.

5. The RF frequency filter structure of claim 1 wherein at least a pair of the second subset of the plurality of resonators are weakly coupled to one another.

6. The RF frequency filter structure of claim 1 further comprising a second cross-coupling capacitive structure wherein:
the second cross-coupling capacitive structure is coupled between the pair of weakly coupled resonators, wherein the second cross-coupling capacitive structure is operable to provide a second variable capacitance.

7. The RF frequency filter structure of claim 6 further comprising a third cross-coupling capacitive structure wherein:
the second subset of the plurality of resonators includes a second pair of weakly coupled resonators;
the third cross-coupling capacitive structure is coupled between the second pair of weakly coupled resonators, wherein the third cross-coupling capacitive structure is operable to provide a third variable capacitance.

8. Radio frequency (RF) front-end circuitry, comprising:
a first terminal;
a second terminal;
a first tunable RF filter path defined between the first terminal and the second terminal, wherein the first tunable RF filter path comprises a pair of weakly coupled resonators and the first tunable RF filter path is configured to be tunable to provide impedance matching between the first terminal and the second terminal at a first frequency; and
a third resonator coupled to one of the pair of weakly coupled resonators so as to provide a first subpath connected to the first tunable RF filter path;
a first cross-coupling capacitive structure operable to provide a first variable capacitance and coupled in the first subpath between the one of the pair of weakly coupled resonators and the third resonator; and
a control circuit configured to tune the first tunable RF filter path to provide impedance matching between the first terminal and the second terminal at the first frequency by adjusting the first variable capacitance so as to adjust a phase of the first tunable RF filter path and provide the impedance matching between the first terminal and the second terminal at the first frequency.

9. The RF front-end circuitry of claim 8 further comprising a second cross-coupling capacitive structure and a third cross-coupling capacitive structure, wherein the second cross-coupling capacitive structure and the third cross-coupling capacitive structure are arranged to form a first capacitive voltage divider.

10. The RF front-end circuitry of claim 9 further comprising a fourth cross-coupling capacitive structure and a fifth cross-coupling capacitive structure, wherein:
the fourth cross-coupling capacitive structure and the fifth cross-coupling capacitive structure are arranged so as to form a second capacitive voltage divider;
the first capacitive voltage divider is electrically connected to the one of the pair of weakly coupled resonators; and
the second capacitive voltage divider is electrically connected to an other of the pair of weakly coupled resonators.

11. The RF front-end circuitry of claim 10 wherein each of the second cross-coupling capacitive structure, the third cross-coupling capacitive structure, the fourth cross-coupling capacitive structure, and the fifth cross-coupling capacitive structure is a variable capacitive structure.

12. The RF front-end circuitry of claim 8 wherein the first tunable RF filter path further comprises a second cross-coupling capacitive structure coupled between the pair of weakly coupled resonators, wherein:
the second cross-coupling capacitive structure is operable to provide a second variable capacitance;
the control circuit is further configured to tune the first tunable RF filter path by adjusting the second variable capacitance so as to provide the impedance matching between the first terminal and the second terminal at the first frequency.

13. The RF front-end circuitry of claim 12 wherein the first tunable RF filter path further comprises a first matching capacitive structure coupled between the first terminal and the one of the pair of weakly coupled resonators, wherein:
the first matching capacitive structure is operable to provide a third variable capacitance;
the control circuit is configured to tune the first tunable RF filter path by adjusting the third variable capacitance so as to provide the impedance matching between the first terminal and the second terminal at the first frequency.

14. The RF front-end circuitry of claim 13 wherein the first tunable RF filter path further comprises a second matching capacitive structure coupled between the second terminal and the other of the pair of weakly coupled resonators, wherein:
the second matching capacitive structure is operable to provide a fourth variable capacitance;
the control circuit is further configured to tune the first tunable RF filter path by adjusting the fourth variable capacitance so as to provide the impedance matching between the first terminal and the second terminal at the first frequency.

15. The RF front-end circuitry of claim 8 further comprising a fourth resonator wherein the third resonator and the fourth resonator are coupled between the pair of weakly coupled resonators so as to provide the first subpath connected to the first tunable RF filter path.

16. The RF front-end circuitry of claim 15 further comprising a second cross-coupling capacitive structure, and a third cross-coupling capacitive structure wherein the second cross-coupling capacitive structure is coupled in the first subpath between the third resonator and the fourth resonator and the third cross-coupling capacitive structure is coupled in the first subpath between an other of the pair of weakly coupled resonators and the fourth resonator wherein:
the second cross-coupling capacitive structure is operable to provide a second variable capacitance;
the third cross-coupling capacitive structure is operable to provide a third variable capacitance; and
the control circuit is further configured to tune the first tunable RF filter path by adjusting the second variable capacitance and the third variable capacitance so as to adjust the phase of the first tunable RF filter path and provide the impedance matching between the first terminal and the second terminal at the first frequency.

17. The RF front-end circuitry of claim 8 wherein the third resonator is coupled between the pair of weakly coupled resonators so as to provide the first subpath connected to the first tunable RF filter path.

18. The RF front-end circuitry of claim 17 further comprising a second cross-coupling capacitive structure coupled in the first subpath between an other of the pair of weakly coupled resonators and the third resonator wherein:
the second cross-coupling capacitive structure is operable to provide a second variable capacitance;
the control circuit is further configured to tune the first tunable RF filter path by adjusting the second variable capacitance so as to adjust the phase of the first tunable RF filter path and provide the impedance matching between the first terminal and the second terminal at the first frequency.

19. The RF front-end circuitry of claim 8 wherein the pair of weakly coupled resonators comprises a first resonator having a first inductor and a second resonator having a second inductor, wherein the first inductor is weakly coupled to the second inductor.

20. The RF front-end circuitry of claim 19 wherein the first resonator further comprises a first plurality of switchable inductive elements, wherein each of the first plurality of switchable inductive elements is configured to be switched so as to be strongly coupled to the first inductor and adjust a first inductance of the first resonator.

21. The RF front-end circuitry of claim 20 wherein the second resonator further comprises a second plurality of switchable inductive elements, wherein each of the second plurality of switchable inductive elements is configured to be switched so as to be strongly coupled to the second inductor and adjust a second inductance of the second resonator.

22. The RF front-end circuitry of claim 19 wherein the first tunable RF filter path further comprises a second cross-coupling capacitive structure electrically connected between the pair of weakly coupled resonators so as to provide a first electric coupling coefficient between the pair of weakly coupled resonators.

23. The RF front-end circuitry of claim 22 wherein the first tunable RF filter path further comprises a third cross-coupling capacitive structure wherein the third cross-coupling capacitive structure is electrically connected between the pair of weakly coupled resonators so as to provide a second electric coupling coefficient between the pair of weakly coupled resonators.

24. The RF front-end circuitry of claim 23 wherein the control circuit is configured to adjust the first electric coupling coefficient and the second electric coupling coefficient.

25. The RF front-end circuitry of claim 24 wherein the third cross-coupling capacitive structure is coupled between the first inductor and the second inductor such that the first electric coupling coefficient is adjusted positively and the third cross-coupling capacitive structure is coupled between the first inductor and the second inductor so that the second electric coupling coefficient is adjusted negatively.

* * * * *